(12) United States Patent
Nishiya et al.

(10) Patent No.: US 7,919,727 B2
(45) Date of Patent: *Apr. 5, 2011

(54) LASER PROCESSING APPARATUS AND LASER PROCESSING METHOD

(75) Inventors: Akira Nishiya, Koshi (JP); Norihisa Koga, Koshi (JP); Naoto Yoshitaka, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 1184 days.

This patent is subject to a terminal disclaimer.

(21) Appl. No.: 11/557,332

(22) Filed: Nov. 7, 2006

(65) Prior Publication Data

US 2007/0119837 A1    May 31, 2007

(30) Foreign Application Priority Data

Nov. 30, 2005   (JP) .................................. 2005-345723

(51) Int. Cl.
   *B23K 26/00*   (2006.01)
(52) U.S. Cl. ........... 219/121.84; 219/121.6; 219/121.85
(58) Field of Classification Search ............. 219/121.84, 219/121.6, 121.85
   See application file for complete search history.

(56) References Cited

U.S. PATENT DOCUMENTS

| 3,991,296 | A  | * | 11/1976 | Kojima et al. ........... 219/121.68 |
| 4,752,668 | A  |   | 6/1988  | Rosenfield et al. |
| 5,496,985 | A  | * | 3/1996  | Foltz et al. ............... 219/121.67 |
| 5,902,499 | A  | * | 5/1999  | Richerzhagen .......... 219/121.84 |
| 7,021,994 | B2 | * | 4/2006  | Ahti et al. ........................ 451/53 |
| 7,622,000 | B2 | * | 11/2009 | Koga et al. .................... 118/300 |
| 7,710,582 | B2 | * | 5/2010  | Koga et al. .................... 356/600 |
| 7,728,258 | B2 | * | 6/2010  | Richerzhagen et al. . 219/121.84 |

FOREIGN PATENT DOCUMENTS

| JP | 3-254111     |   | 11/1991 |
| JP | 4-354321     |   | 12/1992 |
| JP | 2001-321977  | * | 11/2001 |
| JP | 2002-224878  |   | 8/2002  |
| JP | 2003-249427  |   | 9/2003  |
| WO | WO 99/56907  | * | 11/1999 |

* cited by examiner

*Primary Examiner* — M. Alexandra Elve

(74) *Attorney, Agent, or Firm* — Oblon, Spivak, McClelland, Maier & Neustadt, L.L.P.

(57) ABSTRACT

A laser processing apparatus includes: a laser beam radiation part that radiates a laser beam to a target position on a substrate; a liquid supply source; a liquid supply nozzle that is connected to the liquid supply source through a liquid supply channel; a guide member for the ejected liquid; and a movement mechanism that allows a substrate holding part, and the laser beam radiation part, the guide member and the liquid supply nozzle to relatively move in a horizontal direction in a state that a center of a radiation spot of the laser beam is in a projection region on the substrate when the liquid ejection port of the liquid supply nozzle is extended in an ejection direction.

6 Claims, 18 Drawing Sheets

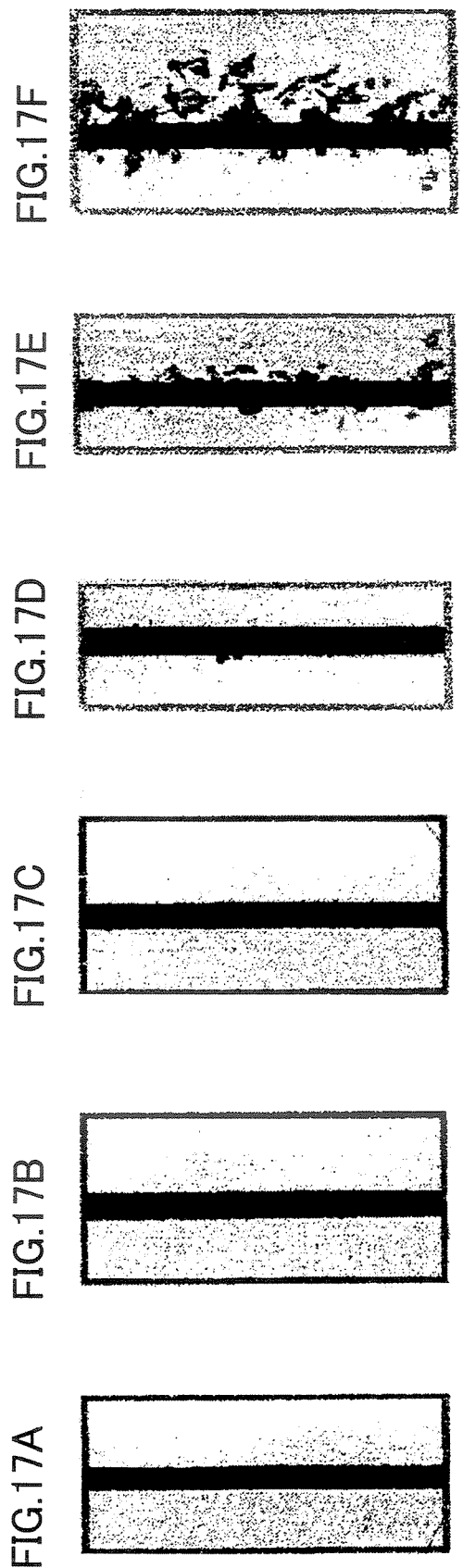

LASER PROCESSING APPARATUS AND LASER PROCESSING METHOD

BACKGROUND OF THE INVENTION

1. Field of the Invention

The present invention relates to a laser processing apparatus and a laser processing method. In the laser processing apparatus and the laser processing method, a substrate is allowed to move horizontally and is radiated with a laser beam in a state that a liquid is supplied onto a surface thereof, thus, the surface of the substrate is subjected to predetermined processing.

2. Description of the Background Art

Conventionally, there has been known the following process. That is, in a sequence of procedures for manufacturing a semiconductor device, a substrate such as a semiconductor wafer (hereinafter, simply referred to as "wafer") or a glass substrate for a liquid crystal display is subjected to predetermined processing by means of a laser beam. For example, Japanese Patent Laying-Open No. 2002-224878 discloses a technique for scanning a surface of a substrate with a laser beam to thereby form a dicing line. Japanese Patent Laying-Open No. 2003-249427 discloses a technique for removing a resist film, that is previously formed on a wafer prior to implementation of exposure processing for the wafer and covers an alignment mark used as a reference for positioning of the wafer, from the wafer by radiation of a laser beam to thereby bare the alignment mark. Generally, a laser beam has large energy and can achieve highly accurate alignment. Therefore, the laser beam is suitably used in such processing.

When the resist film is removed from the surface of the substrate by radiation of the laser beam, substances to be processed, that is, cuttings of the film are attached to the surface of the substrate and the film around the processed portion is heated due to the laser beam, resulting in an influence on subsequent processing for the substrate. In order to suppress the influence due to attachment of the cuttings and heat to the film, a liquid such as pure water is supplied onto the surface of the substrate to form a liquid film and the surface of the substrate is radiated with a laser beam through the liquid film.

Japanese Patent Laying-Open No. 2003-249427 discloses a laser processing apparatus that radiates a laser beam to the surface of the wafer having the resist film formed thereon through a liquid film, removes the resist film from a target position (film removal position), and bares the alignment mark. Hereinafter, brief description will be given of a configuration of this laser processing apparatus with reference to FIGS. 18A and 18B. A chuck 11 for holding a wafer W is connected to a drive part (not illustrated) through a support part 12 and is movable horizontally. A main nozzle 13 ejects pure water, to which a pressure is applied by means of pressure applying gas such as $N_2$ (nitrogen) gas, toward a target position 10 on wafer W. A guide member 14 disposed on target position 10 in laser processing plays a role of guiding a stream of a liquid supplied from main nozzle 13 and a stream of a liquid supplied from a sub nozzle (to be described later), and is connected to main nozzle 13 through a support member 14a. Herein, guide member 14 is made of, for example, quartz so as to allow a laser beam to transmit therethrough. A laser beam radiation part 16 radiates a laser beam to target position 10 as shown by a dot line in the figure.

Sub nozzles 17 and 18 are provided to guide member 14, respectively. Each of sub nozzles 17 and 18 is opened at a bottom face of guide member 14. As illustrated FIG. 18B, sub nozzles 17 and 18 are provided symmetrically with main nozzle 13 interposed therebetween when being seen from above. Each of sub nozzles 17 and 18 plays a role of ejecting pure water toward target position 10 at a flow rate slower than that of main nozzle 13 to thereby suppress extension of the stream of the liquid supplied from main nozzle 13. A liquid recovery part 19 sucks the pure water, that is supplied from each of nozzles 13, 17 and 18 and, then, passes below guide member 14, to remove the pure water from wafer W.

Wafer W is subjected to predetermined processing by the aforementioned laser processing apparatus in the following manner. First, guide member 14 is allowed to move to a position above target position 10. Then, pure water is ejected from each of nozzles 13, 17 and 18. On the other hand, liquid recovery part 19 sucks the pure water. A liquid stream 10a is formed between wafer W and guide member 14. Target position 10 is radiated with a laser beam by laser beam radiation part 16, so that a film on target position 10 is cut. Cuttings of the film are washed out by the pure water, and liquid recovery part 19 removes the cuttings and the pure water from wafer W.

A laser beam used herein is intermittently emitted in form of a pulse toward target position 10 for each 20 μsec, for example. This emission of the laser beam in form of a pulse causes the following disadvantage. That is, a component of the film at target position 10 is evaporated, and this evaporated component absorbs energy of the emitted laser beam in form of a pulse, so that plasma is generated at target position 10. This plasma abruptly compresses a surrounding liquid, so that air bubbles each having a diameter of about 1 mm are generated at target position 10. In a state that such air bubbles are generated at target position 10, a laser beam in form of a pulse is intermittently emitted toward target position 10 to thereby collide with the air bubble. As a result, the laser beam causes optical scattering, and is disadvantageously emitted to a portion other than target position 10. Consequently, the film on target position 10 is not processed satisfactorily, the film other than the film on the target position 10 is damaged, and delamination occurs at the damaged film upon reception of a pressure of liquid stream 10a.

In order to prevent scattered reflection of the laser beam, a radiation position of wafer W of a laser beam and each nozzle for supplying the liquid are appropriately adjusted, so that air bubbles generated due to the plasma must be promptly removed from a target position by washout.

In order to sufficiently remove the cuttings of the film from wafer W by washout using a liquid stream in the laser processing apparatus, pure water to be ejected from main nozzle 13 must be applied with a pressure so as to secure a flow rate to a degree. If the flow rate of the pure water from main nozzle 13 is accelerated, the air bubbles generated due to the plasma can be promptly washed out from target position 10, so that optical scattering of the laser beam due to the air bubbles can be suppressed.

In a case that the flow rate is accelerated, however, a change in pressure to be applied to the pure water ejected from main nozzle 13 onto wafer W is considerable. As a result, so-called cavitation, in which gas dissolved in the pure water appear as micro bubbles in the liquid stream, readily occurs. In a case that a laser beam collides with the micro bubbles, optical scattering occurs as in the case that the laser beam collides with the air bubbles generated due to the plasma. As a result, target position 10 is not sufficiently radiated with the laser beam, and the portion other than target position 10 is disadvantageously radiated with the laser beam.

Neither Japanese Patent Laying-Open No. 2002-224878 nor Japanese Patent Laying-Open No. 2003-249427 discloses not only the aforementioned problems but also solution of the problems.

SUMMARY OF THE INVENTION

An object of the present invention is to provide a laser processing apparatus and a laser processing method. According to the present invention, in a case that a substrate is subjected to processing with a laser beam while a liquid is supplied thereto, an influence of an air bubble generated in the liquid can be suppressed and a target position on the substrate can be radiated with the laser beam with high accuracy.

The present invention provides a laser processing apparatus including: a substrate holding part that holds a substrate horizontally; a laser beam radiation part that radiates a laser beam to a target position on the substrate to thereby carry out predetermined processing on a surface of the substrate; a liquid supply source that supplies a liquid while applying a pressure to the liquid; a liquid supply nozzle that is connected to the liquid supply source through a liquid supply channel, includes a liquid ejection port having a bore in a range from 0.4 mm to 1.0 mm, and supplies the liquid supplied from the liquid supply source to the substrate held by the substrate holding part at a flow rate in a range from 20 m/s to 30 m/s in a direction of a depression angle in a range from 20° to 35°; a guide member that is provided above the substrate, guides the liquid ejected from the liquid supply nozzle such that the liquid passes between a bottom face thereof and the surface of the substrate, and is made of a transparent material for allowing the laser beam from the laser beam radiation part to transmit therethrough; and a movement mechanism that allows the substrate holding part, and the laser beam radiation part, the guide member and the liquid supply nozzle to relatively move in a horizontal direction such that a radiation spot of the laser beam from the laser beam radiation part shifts in the surface of the substrate in a state that a center of the radiation spot is in a projection region on the surface of the substrate when the liquid ejection port of the liquid supply nozzle is extended in an ejection direction. Herein, for example, a height from a center of the liquid ejection port to the substrate is in a range from 0.5 mm to 1.5 mm upon supply of the liquid to the substrate.

The present invention also provides a laser processing apparatus including: a substrate holding part that holds a substrate horizontally; a laser beam radiation part that radiates a laser beam to a target position on the substrate to thereby carry out predetermined processing on a surface of the substrate; a liquid supply source that supplies a liquid while applying a pressure to the liquid; a liquid supply nozzle that is connected to the liquid supply source through a liquid supply channel, and supplies the liquid supplied from the liquid supply source onto the substrate through a liquid ejection port thereof; a guide member that is provided above the substrate, guides the liquid supplied from the liquid supply nozzle such that the liquid passes between a bottom face thereof and the surface of the substrate, and is made of a transparent material for allowing the laser beam from the laser beam radiation part to transmit therethrough; a deaeration unit that removes gas in the liquid passing through the liquid supply channel; and a movement mechanism that allows the substrate holding part, and the laser beam radiation part and the guide member to relatively move in a horizontal direction in order to shift a radiation spot of the laser beam in the surface of the substrate.

In the laser processing apparatus according to the present invention, for example, the liquid supply source includes a first liquid supply source that supplies gas from a gas supply source to a liquid reservoir part to thereby supply a liquid in the liquid reservoir part while applying a pressure to the liquid, and a second liquid supply source that is industrial equipment, the first liquid supply source is connected with a first liquid supply nozzle that washes out a substance to be processed on the substrate by the laser beam through a first liquid supply channel, the second liquid supply source is connected with a pair of second liquid supply nozzles that are located at both ends of the first liquid supply nozzle and control a stream of the liquid from the first liquid supply nozzle, the first liquid supply channel has a first deaeration unit that removes gas in the liquid passing through the first liquid supply channel, and the second liquid supply channel has a second deaeration unit that removes gas in the liquid passing through the second liquid supply channel.

The present invention also provides a laser processing method including the steps of: mounting a substrate on a substrate holding part horizontally; supplying a liquid, supplied from a liquid supply source to a liquid supply nozzle, to the substrate at a flow rate in a range from 20 m/s to 30 m/s in a direction of a depression angle in a range from 20° to 35°, wherein the liquid supply source supplies the liquid through a liquid supply channel while applying a pressure to the liquid, and the liquid supply nozzle includes a liquid ejection port having a bore in a range from 0.4 mm to 1.0 mm and is connected to the liquid supply source; radiating a laser beam to the substrate from a laser beam radiation part through a guide member provided above the substrate and made of a transparent material for allowing the laser beam from the laser beam radiation part to transmit therethrough, in a state that the liquid ejected from the liquid supply nozzle is guided so as to pass between a bottom face of the guide member and the surface of the substrate; and allowing the substrate holding part, and the laser beam radiation part, the guide member and the liquid supply nozzle to relatively move in a horizontal direction such that a radiation spot of the laser beam shifts in the surface of the substrate in a state that a center of the radiation spot is in a projection region on the surface of the substrate when the liquid ejection port of the liquid supply nozzle is extended in an ejection direction.

The present invention also provides a laser processing method including the steps of: mounting a substrate on a substrate holding part horizontally; supplying a liquid from a liquid supply source for supplying the liquid while applying a pressure to the liquid to a liquid supply nozzle connected to the liquid supply source through a liquid supply channel, and ejecting the liquid from a liquid ejection port of the liquid supply nozzle onto the substrate; removing gas in the liquid passing through the liquid supply channel; guiding the liquid ejected from the liquid supply nozzle by a guide member provided above the substrate and made of a transparent material for allowing a laser beam from a laser beam radiation part to transmit therethrough, such that the liquid passes between a bottom face of the guide member and a surface of the substrate; and allowing the substrate holding part, and the laser beam radiation part and the guide member to relatively move in a horizontal direction in order to shift a radiation spot of the laser beam in the surface of the substrate.

According to one aspect of the present invention, in a case that predetermined processing is carried out in such a manner that a surface of a substrate is radiated with a laser beam through a liquid guided by a guide member, a liquid supply nozzle including a liquid ejection port having a bore in a range from 0.4 mm to 1.0 mm supplies the liquid to the surface of the substrate at a flow rate in a range from 20 m/s to 30 m/s in a direction of a depression angle in a range from 20° to 35° and, further, a radiation spot of the laser beam from a laser beam radiation part shifts in the surface of the substrate in a state that a center of the radiation spot is in a projection region on the surface of the substrate when the liquid ejection port of the liquid supply nozzle is extended in an ejection direction. With this processing, air bubbles generated in the liquid due to plasma generated by radiation of the laser beam to the substrate are efficiently washed out from the radiation spot (target position) on the substrate; thus, optical scattering of the laser beam can be suppressed. As a result, the target position on the substrate can be radiated with the laser beam with high accuracy.

According to another aspect of the present invention, in a case that predetermined processing is carried out in such a manner that a surface of a substrate is radiated with a laser beam through a liquid guided by a guide member, gas in the liquid supplied from a liquid supply source connected to a liquid supply nozzle through a liquid supply channel is removed from the liquid by a deaeration unit provided in the liquid supply channel when the liquid passes through the liquid supply channel; therefore, occurrence of cavitation can be suppressed upon ejection of the liquid ejected from the liquid supply nozzle. As a result, generation of air bubbles in the liquid supplied onto the substrate can be suppressed, and optical scattering of the laser beam due to the air bubbles can be suppressed.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 17A to 17F are photographs each showing an evaluation criteria of a dicing line formed on a wafer in an evaluation test.

DESCRIPTION OF THE PREFERRED EMBODIMENTS

Figure 1:
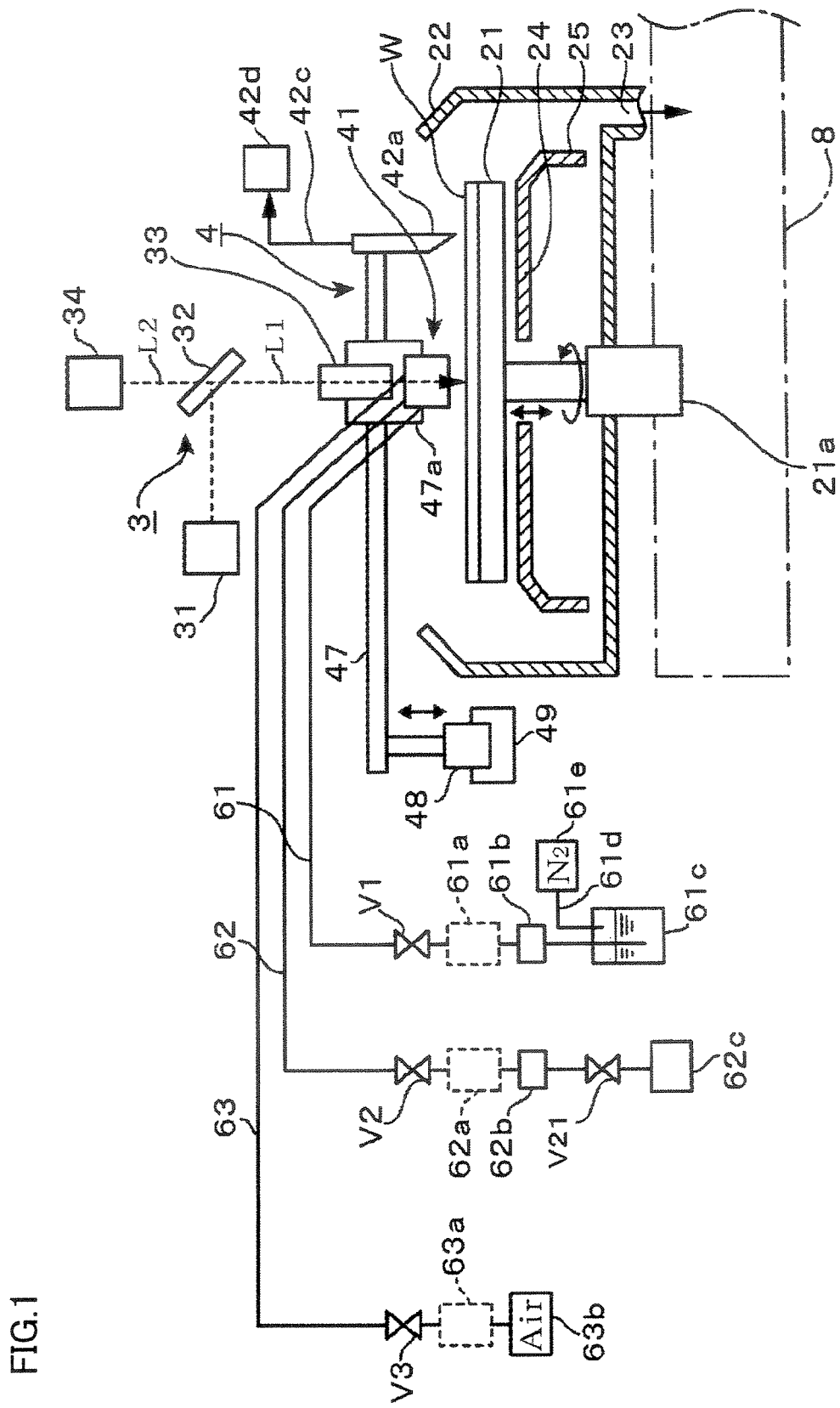
FIG. 1 is a vertical sectional view illustrating a general configuration of a laser processing apparatus according to one embodiment of the present invention.

As one example of a laser processing apparatus according to an embodiment of the present invention, hereinafter, description will be given of a laser processing apparatus performing predetermined processing such as dicing on a substrate, that is, a wafer W. FIG. 1 illustrates a general configuration of the laser processing apparatus. A chuck 21 serving as a substrate holding part for suction holding wafer W horizontally has a size almost equal in plane to that of wafer W in order to prevent wafer W from defection. Herein, the size almost equal in plane means that chuck 21 is equal in size to wafer W to a degree that wafer W is prevented from defection. For example, if chuck 21 has a diameter within about ±10 mm of that of wafer W, it can be said that chuck 21 is equal in size to wafer W.

Chuck 21 is arranged in a cup 22 formed into an almost cylindrical shape with a top face thereof opened. Chuck 21 can rotate about a vertical axis by a drive part 21a provided at a center of a bottom of cup 22, and can move vertically. In addition, chuck 21 is connected to cup 22 and, therefore, can move horizontally together with cup 22 by an X-Y stage 8 (to be described later). The bottom of cup 22 is provided with a discharge port 23 for discharging a liquid, for example, pure water dropped from wafer W and degassing cup 22. In cup 22, a ring-shaped horizontal plate part 24 is provided so as to surround chuck 21 at a position immediately below wafer W held by chuck 21. Further, an outer edge of horizontal plate part 24 is bent downward to form a cylindrical part 25.

The laser processing apparatus includes a laser beam radiation part 3 for radiating a laser beam to a region to be radiated with a laser beam on wafer W, and a liquid film formation part 4 for forming a liquid film on wafer W. Laser beam radiation part 3 is fixed to a casing (not illustrated) serving as an exterior of the laser processing apparatus. Laser beam radiation part 3 includes a laser beam oscillator 31 that oscillates a laser for processing, such as a YAG laser or an excimer laser at, for example, 50 kHz, a half mirror 32 that bends the laser beam from laser beam oscillator 31 downward in a vertical direction to thereby direct the laser beam toward a surface of wafer W, and a laser convergence processing optical unit (hereinafter, simply referred to as "optical unit") 33 that is provided at a downstream side of half mirror 32 and converges the laser beam on wafer W. A CCD (Charge Coupled Device) camera 34 serving as an imaging section plays a role of detecting an alignment portion such as a notch or an orientation flat previously formed at a predetermined position on wafer W. CCD camera 34 is fixed to the casing of the laser processing apparatus such that an optical axis L2 thereof is aligned with an optical axis L1 of the laser beam directed from half mirror 32 toward the surface of wafer W.

Figure 2:
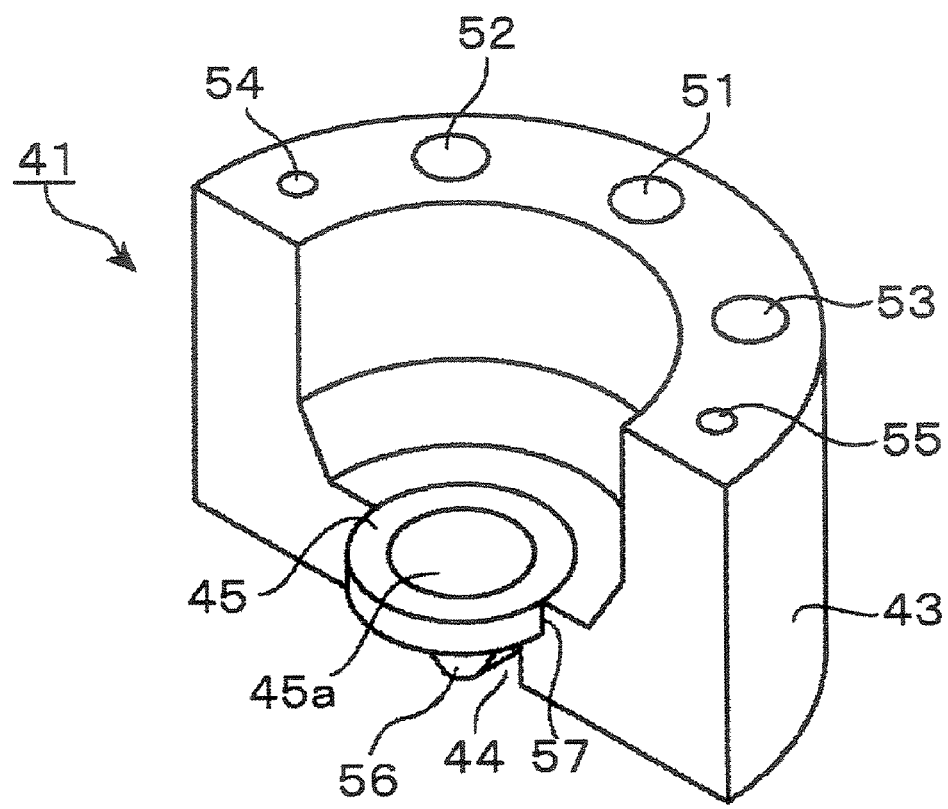
FIG. 2 is a perspective view illustrating one example of a nozzle unit provided in the laser processing apparatus.
Figure 3:
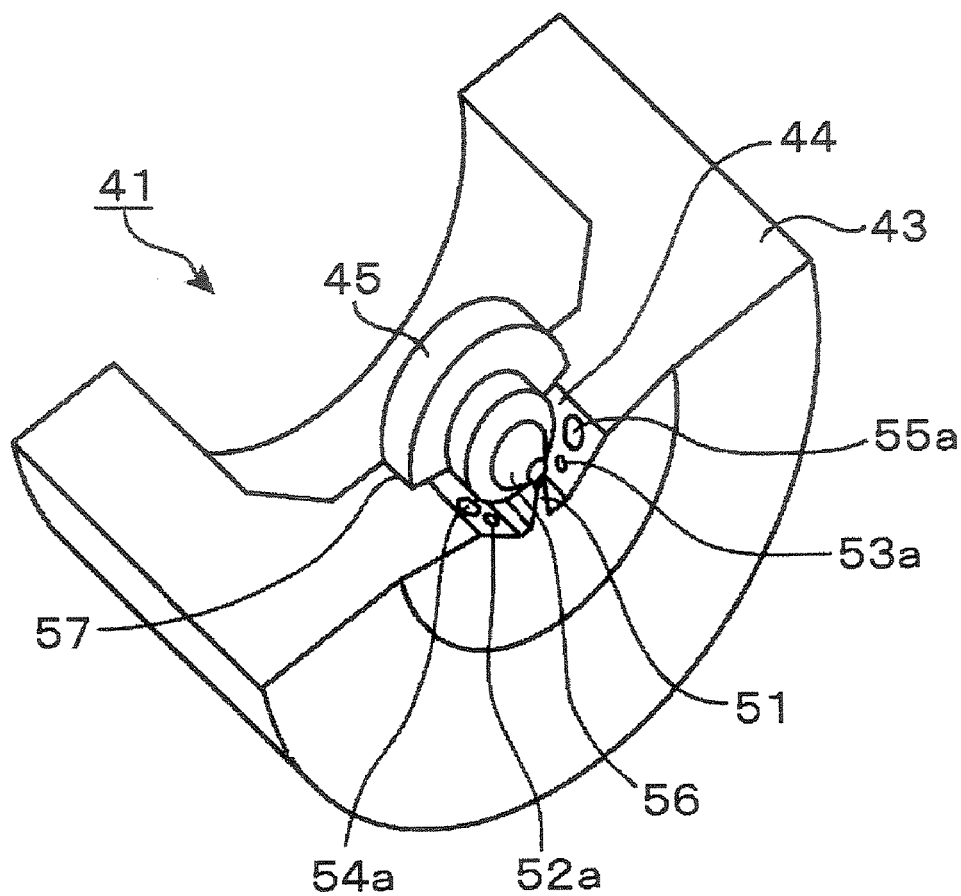
FIG. 3 is a perspective view illustrating the nozzle unit.
Figure 4:
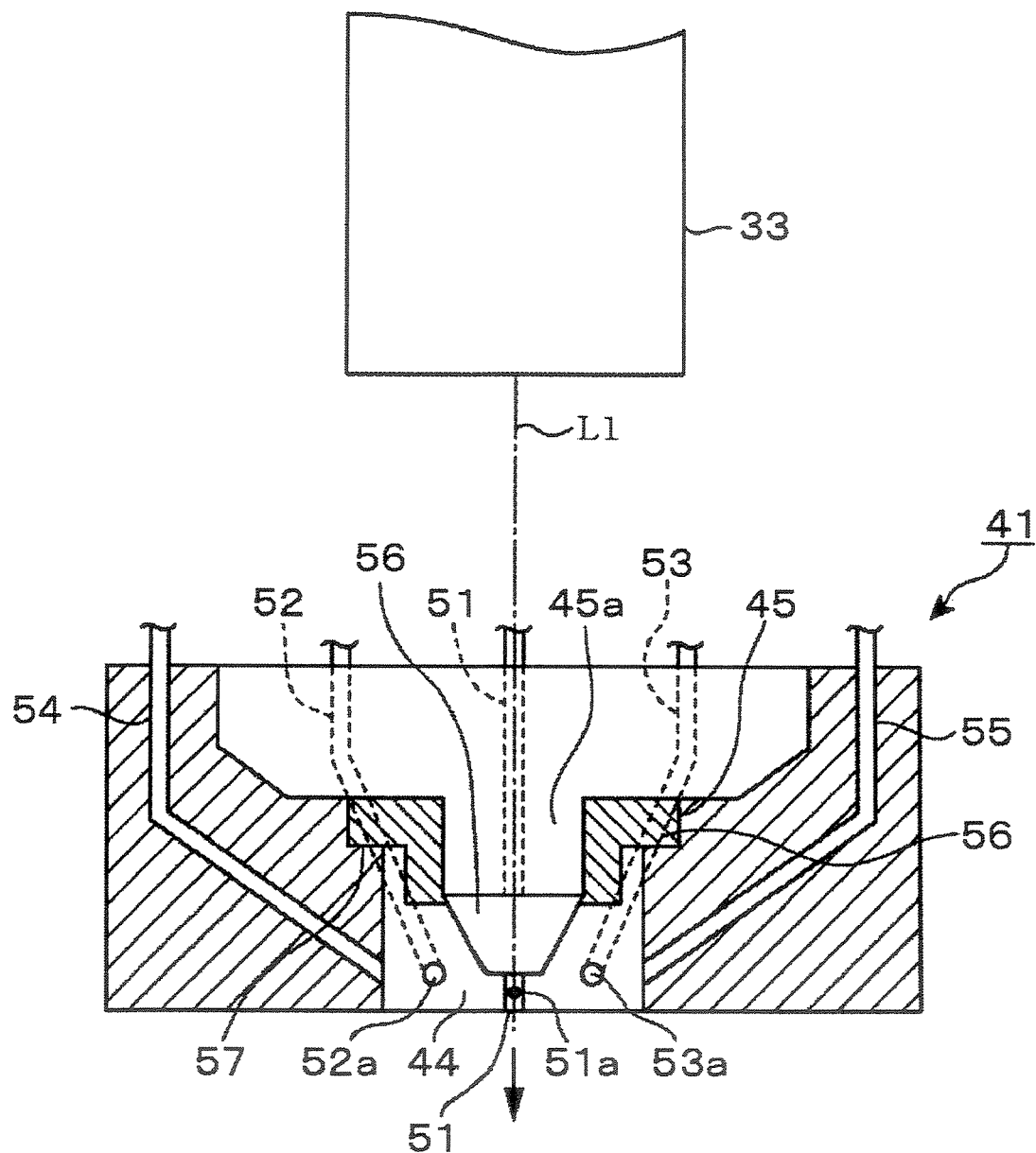
FIG. 4 is a sectional view illustrating the nozzle unit.
Figure 5:
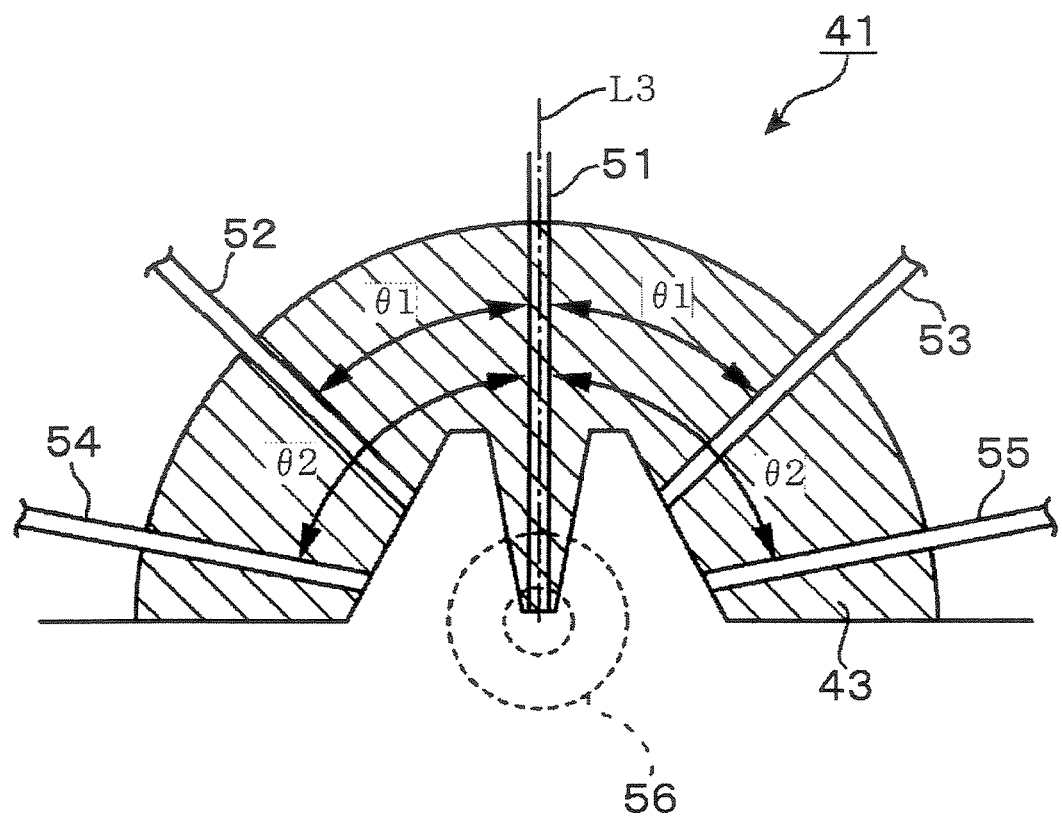
FIG. 5 is a plan view partially illustrating the nozzle unit.

Liquid film formation part 4 includes a nozzle unit 41 that has liquid supply channels, for example, liquid supply conduits for supplying a liquid such as pure water and purge gas onto wafer W, respectively, and includes a plurality of ejection nozzles, and a liquid recovery part 42 that recovers a liquid passing a position radiated with the laser beam on the surface of wafer W. As illustrated in FIG. 2 (perspective view), FIG. 3 (perspective view when being seen from obliquely downward side), FIG. 4 (sectional view) and FIG. 5 (schematic plan view), for example, nozzle unit 41 includes one main nozzle 51 serving as a liquid supply nozzle, and a pair of sub nozzles 52 and 53 provided at both ends of main nozzle 51. Each of main nozzle 51, sub nozzle 52 and sub nozzle 53 plays a role of forming a stream of a liquid passing a target position on wafer W in the laser processing as will be described later, thereby suppressing an influence exerted on a periphery of the target position due to heat of the laser beam, and washing out a substance to be removed (substance to be processed) of a film on the surface of wafer W by the laser beam, thereby suppressing attachment of the substance to be removed onto the surface of the wafer W. Herein, main nozzle 51 corresponds to a first liquid supply nozzle, and each of sub nozzles 52 and 53 corresponds to a second liquid supply nozzle.

Nozzle unit 41 also includes two purge nozzles 54 and 55 each supplying purge gas to wafer W and a guide member 56 (to be described later), and guide member 56 guiding a liquid, which is ejected from each of main nozzle 51, sub nozzle 52 and sub nozzle 53 and flows on wafer W, to form a liquid film. Herein, nozzles 51 to 55 are provided inside a nozzle main body 43. Guide member 56 is made of a transparent material such as quartz glass in order to allow the laser beam to transmit therethrough, and is formed into an inversed conical shape having a flat bottom face.

Nozzle main body 43 has an almost semi-circular planar shape, and is obtained by integrally molding nozzles 51 to 55 as a structural body having a semi-cylindrical shape. Nozzle main body 43 is made of resin such as polyvinyl chloride (PVC) or polytetrafluoroetylene. An opening 44 having an almost semi-circular planar shape is formed at a central region of nozzle main body 43, and guide member 56 is arranged in opening 44.

A fixing member 55 is used for fixing guide member 56 to nozzle main body 43, and is made of resin such as PVC or polytetrafluoroetylene or ceramic. It is needless to say that nozzles 51 to 55 are not integrally molded into one as nozzle main body 43.

An opening 45a, which is larger than a bottom face of guide member 56 and is smaller than a top face of guide member 56, is formed at a central region of fixing member 45. Guide member 56 inserted into opening 45a is secured to fixing member 45 in a state that an upper portion thereof is caught in opening 45a, and fixing member 45 in this state is secured to a step 57 formed in nozzle main body 43. As a result, guide member 56 is arranged at a predetermined position on nozzle main body 43.

In each of main nozzle 51, sub nozzles 52 and 53, and purge nozzles 54 and 55, an ejection port is formed outside guide member 56 so as to supply a liquid or purge gas toward a region in the vicinity of the bottom face of guide member 56 arranged in nozzle main body 43. In other words, nozzles 51, 52, 53, 54 and 55 include ejection ports 51a, 52a, 53a, 54a and 55a, respectively. Each of ejection ports 51a to 55a has a circular opening.

Main nozzle 51 is provided in such a manner that ejection port 51a is located at an almost center immediately under the bottom face of guide member 56 when guide member 56 is arranged in nozzle main body 43. Sub nozzles 52 and 53 are provided in such a manner that ejection ports 52a and 53a are located symmetrically with respect to main nozzle 51 as a center. Purge nozzles 54 and 55 are provided in such a manner that ejection ports 54a and 55a are located symmetrically with respect to main nozzle 51 as a center at the outsides of sub nozzles 52 and 53, respectively. More specifically, when a line L3 connecting between main nozzle 51 and the center of the bottom face of guide member 56 is a center line, sub nozzles 52 and 53 are arranged so as to be spaced away from center line L3 symmetrically at an angle $\theta 1$ ($30° \leq \theta 1 \leq 55°$). Similarly, purge nozzles 54 and 55 are arranged so as to be spaced away from center line L3 symmetrically at an angle $\theta 2$ ($65° \leq \theta 2 \leq 85°$). That is, ejection port 51a of main nozzle 51 is located at a position in the vicinity of the center of the bottom face of guide member 56, and ejection ports 52a, 53a 54a and 55a of sub nozzles 52 and 53 and purge nozzles 54 and 55 are located at a periphery of the bottom face of guide member 56.

A support member 47a is used for fixing nozzle unit 41 and optical unit 33 to a holding arm 47. Holding arm 47 has a base end connected to a vertical-movement mechanism 48 for allowing holding arm 47 to move vertically, and a tip end connected to a liquid recovery nozzle 42a (to be described later). Vertical-movement mechanism 48 can move together with holding arm 47 along a rail 49 extending in a direction perpendicular to a paper face of FIG. 1. With this configuration, nozzle unit 41, optical unit 33 and liquid recovery nozzle 42a are movable between a processing position where wafer W is radiated with a laser beam and a standby position located outside cup 22. When optical unit 33 and nozzle unit 41 are arranged at the processing position, the surface of wafer W is radiated with the laser beam from laser beam oscillator 31 through optical unit 33 and guide member 56.

Figure 6:
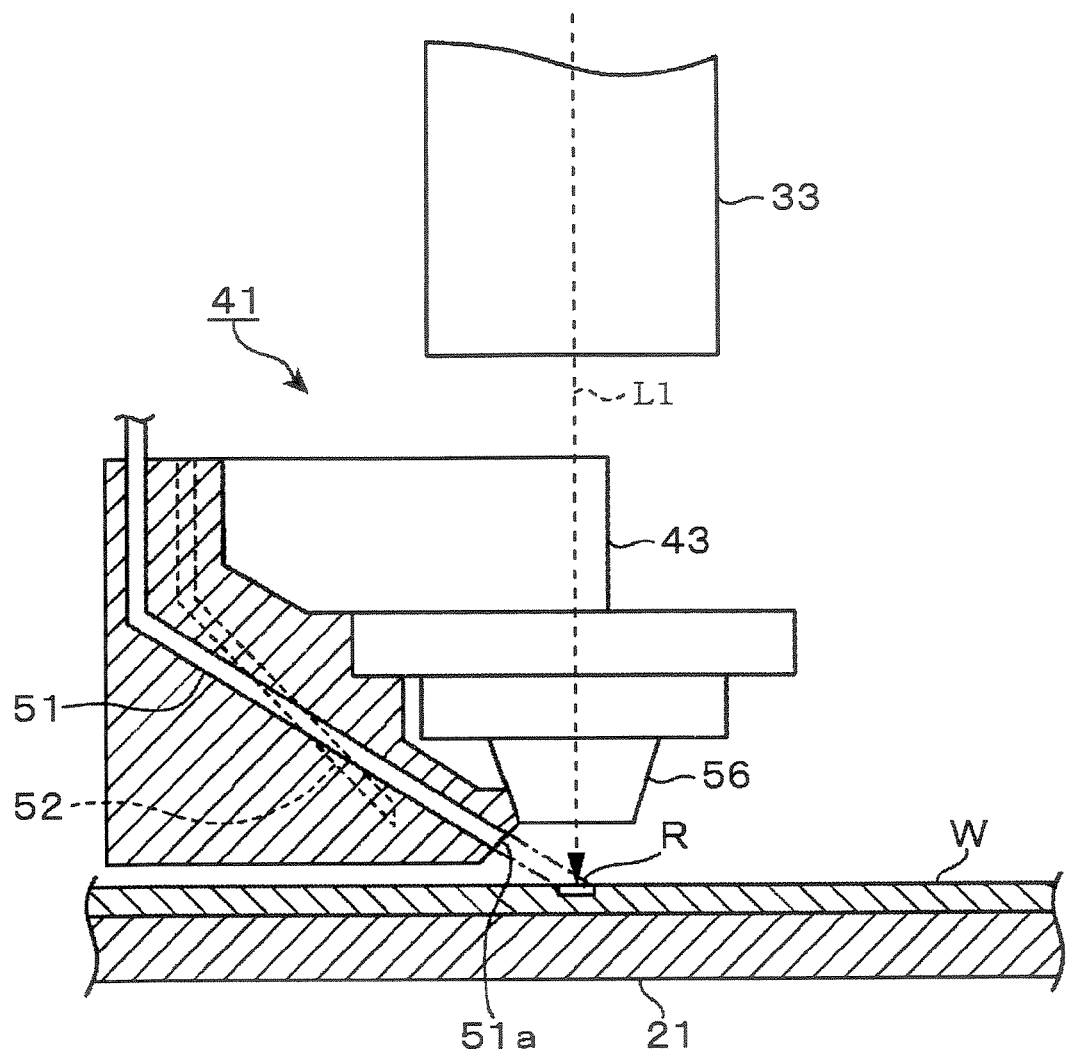
FIG. 6 illustrates a positional relation between a region where a main nozzle of the nozzle unit is projected to a substrate and an optical axis of a laser beam to be emitted to the substrate.
Figure 7:
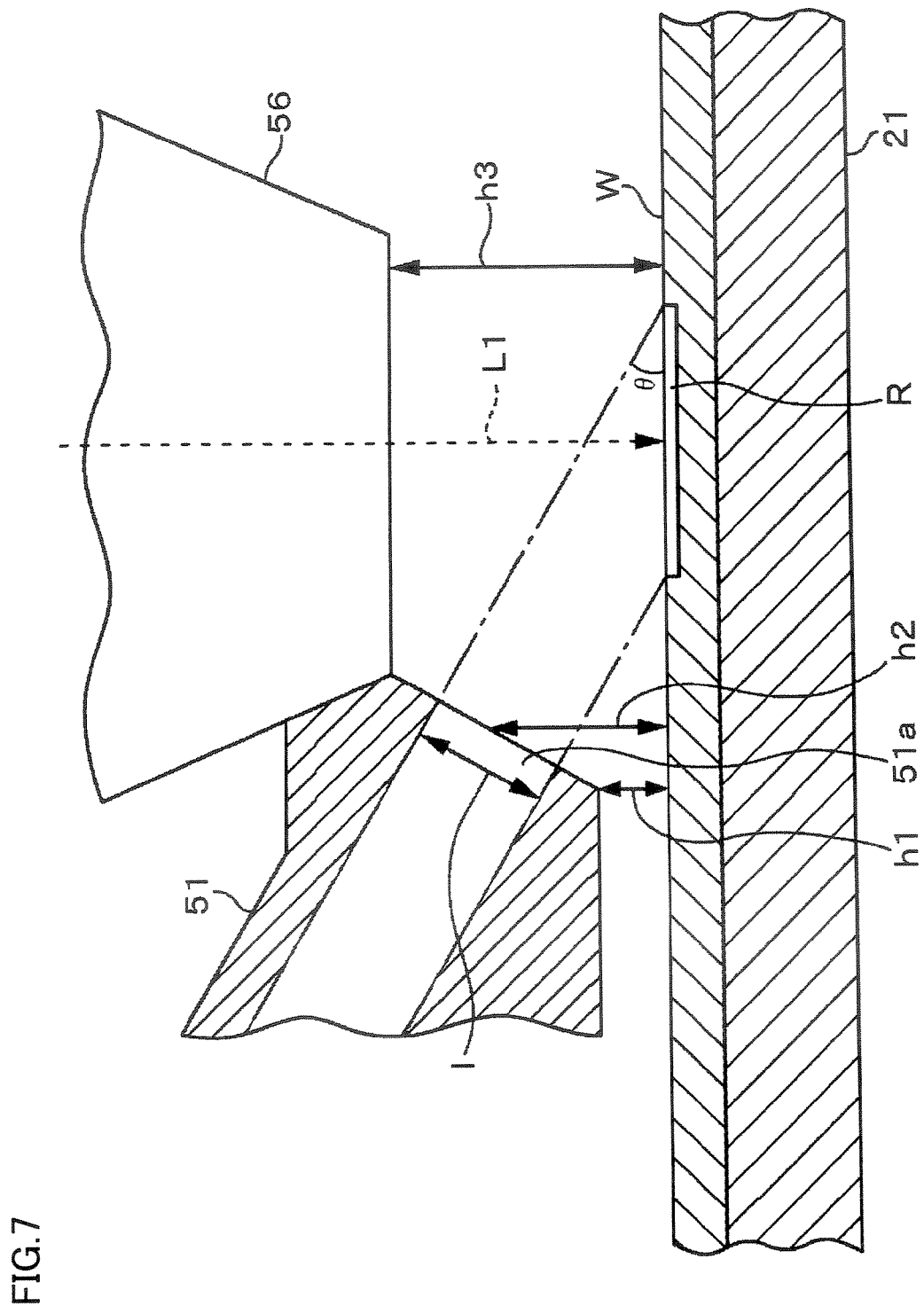
FIG. 7 illustrates a positional relation among dimensions of respective components of the main nozzle, the region where the main nozzle is projected to the substrate, and the optical axis of the laser beam to be emitted to the substrate.

Each of FIGS. 6 and 7 illustrates a positional relation between main nozzle 51 of nozzle unit 41 arranged at the processing position and the target position, which is radiated with the laser beam, on wafer W mounted on chuck 21, and a configuration of main nozzle 51. A height h1 from a lower end of main nozzle 51 to wafer W is preferably not less than 0.2 mm in order to prevent contact between wafer W and main nozzle 51.

Main nozzle 51 is configured as follows in order to suppress scattered reflection of the laser beam due to air bubbles caused by plasma generated upon radiation of wafer W with the laser beam. As shown by a chain line in the figure, main nozzle 51 ejects pure water in a direction of a depression angle. Herein, an angle $\theta$ formed by a pure water ejecting direction and wafer W is in a range from 20° to 35°. As described above, ejection port 51a opened in a circular shape has a bore 1 in a range from 0.4 mm to 2.0 mm. If a value of angle $\theta$ exceeds 35°, there is a possibility that processing cannot be carried out in terms of the structure of main nozzle 51. On the other hand, if the value of angle $\theta$ is less than 20°, there is a possibility that a flow rate becomes slow due to an influence of drag of pure water because a distance between main nozzle 51 and a processing point (target position) on wafer W becomes long. In a case that the pure water is ejected from ejection port 51a at a predetermined flow rate, as ejection port 51a is large in bore, an amount of pure water to be supplied to the position radiated with the laser beam on wafer W becomes large. This is advantageous because air bubbles are readily washed out from a processing region. However, if bore 1 exceeds 2.0 mm, an amount of pure water to be used herein becomes excessively large. Consequently, there is a possibility that cost for laser processing increases disadvantageously. Moreover, if bore 1 is less than 0.4 mm, the air bubbles cannot be washed out sufficiently. Consequently, there is a possibility that effects of this embodiment cannot be achieved satisfactorily.

A height h2 from a center of ejection port 51a to wafer W is preferably in a range from 0.5 mm to 1.5 mm. If height h2 exceeds 1.5 mm, there is a possibility that a flow rate becomes slow due to drag of pure water because a distance between main nozzle 51 and the processing point becomes long. On the other hand, if height h2 is less than 0.5 mm, there is a possibility that the bottom face of main nozzle 51 comes into contact with wafer W. FIG. 7 also illustrates a projection region R where ejection port 51a is projected onto wafer W. The laser beam from laser beam oscillator 31 has an optical axis L1 directed to projection region R through optical unit 33 and guide member 56. Herein, a height h3 from wafer W to guide member 56 is about 2 mm.

Figure 8A:
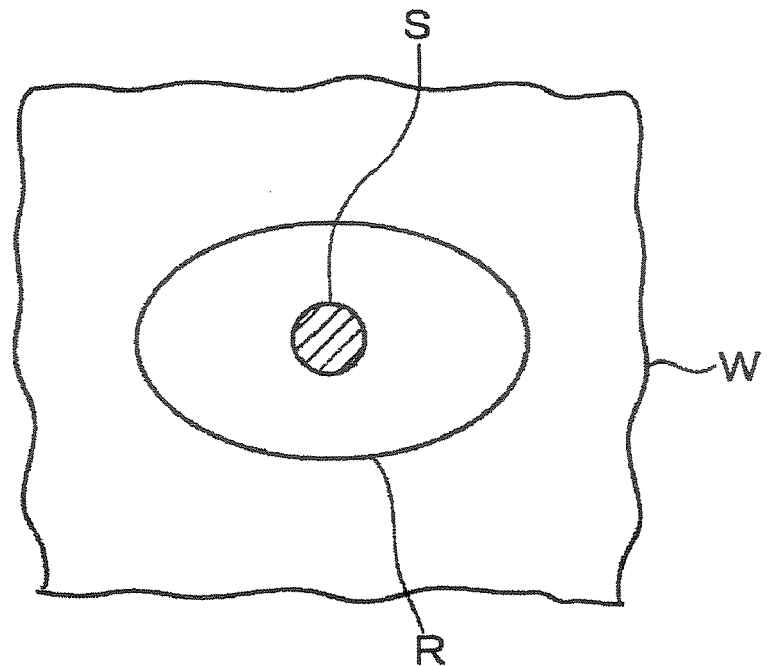
FIGS. 8A and 8B illustrate a positional relation between the projection region and a spot of the laser beam on the substrate.
Figure 8B:
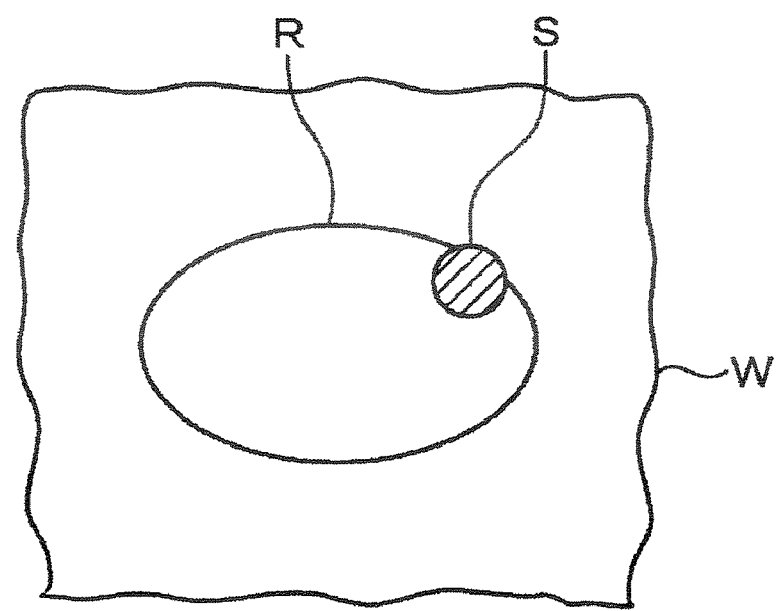

FIGS. 8A and 8B illustrate projection region R in a case that the target position is radiated with the laser beam, when being seen from above. Herein, if a circular-shaped radiation spot (target position) S is formed on wafer W by the laser beam, a center thereof is in projection region R. Radiation spot S may be partially out of projection region R as long as the center thereof is in projection region R as illustrated in FIG. 8B. Herein, radiation spot S has a diameter in a range from 50 μm to 100 μm, for example.

Figure 9:
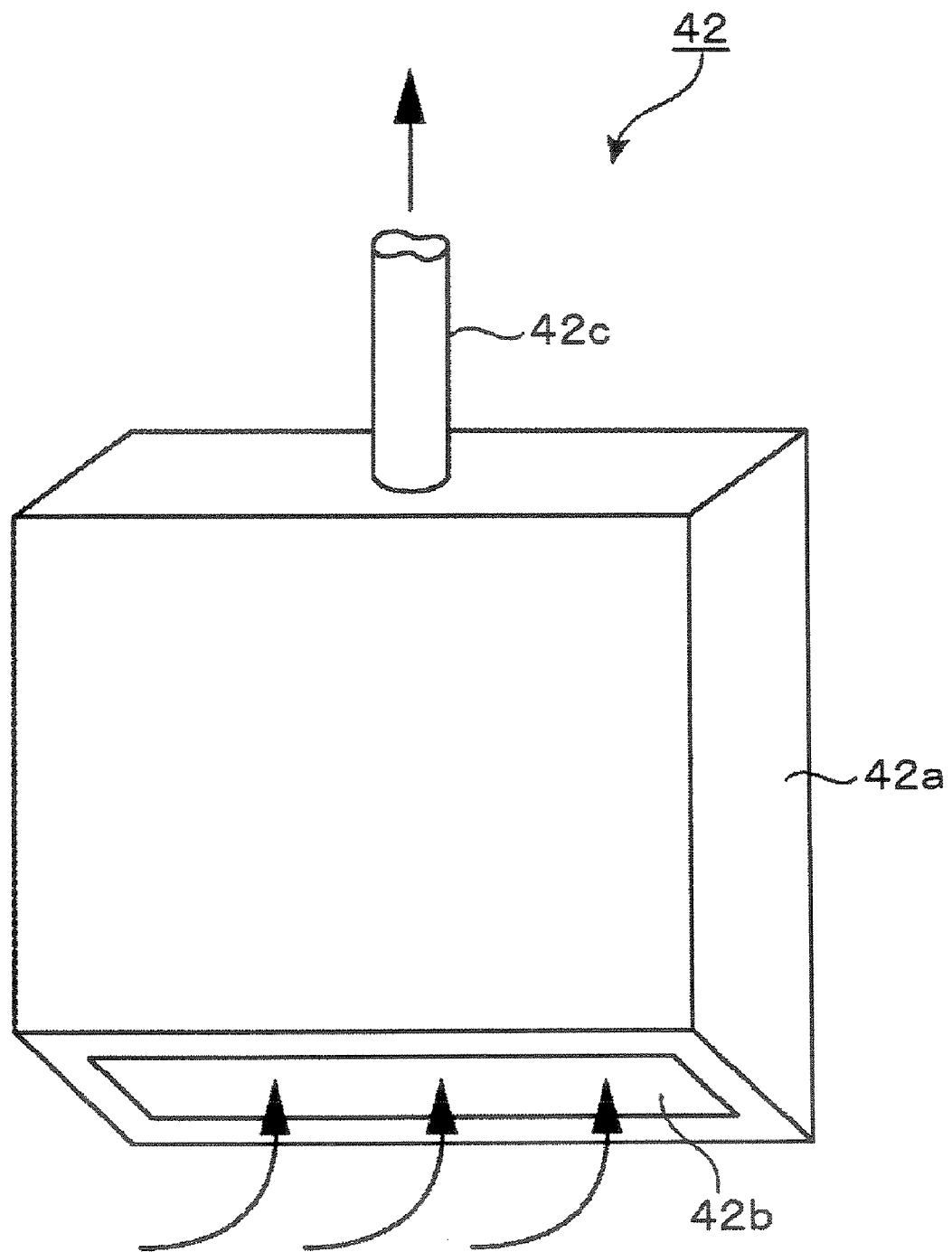
FIG. 9 is a perspective view schematically illustrating a recovery nozzle in the embodiment.

Next, description will be given of liquid recovery part 42. As illustrated in FIG. 9, liquid recovery part 42 is formed into an almost rectangular parallelepiped shape, and includes a recovery nozzle 42a having a suction port 42b at its tip end so as to recover a strip-shaped liquid stream formed on wafer W, and a sucking section 42d such as an ejector acting a suction force on recovery nozzle 42a through a liquid recovery channel 42c.

Herein, nozzle unit 41 and recovery nozzle 52a are provided such that guide member 56 of nozzle unit 41 and recovery nozzle 52a oppose each other and a distance therebetween is about 100 mm, for example. Nozzle unit 41 and recovery nozzle 42a are fixed to holding arm 47, respectively, in such a positional relation that a lower end of recovery nozzle 42a is located above wafer W by about 1 mm when nozzle unit 41 is at the processing position.

Main nozzle 51 is connected with one end of a first liquid supply channel 61 for supplying pure water to main nozzle 51. Sub nozzles 52 and 53 are connected with one end of a second liquid supply channel 62 for supplying pure water to sub nozzles 52 and 53. The other end of first liquid supply channel 61 is connected to a pure water reservoir tank 61c, which is a reservoir part of pure water, through a valve V1, a group of liquid supply devices 61a and a first deaeration unit 61b in this order. At a gaseous phase portion of reservoir tank 61c, one end of a supply channel 61d for pressure applying gas is opened for supplying pure water to a downstream side of first liquid supply channel 61. The other end of gas supply channel 61d is connected to a gas supply source 61e having N₂ gas stored therein. Herein, pure water reservoir tank 61c, gas supply channel 61d and gas supply source 61e configure a first liquid supply source.

The other end of second liquid supply channel 62 is connected to a pure water supply source 62c through a valve V2, a group of liquid supply devices 62a, a second deaeration unit 62b and a valve V21 in this order. Pure water supply source 62c is a second liquid supply source for supplying pure water to second liquid supply channel 62 while applying a pressure to the pure water. Herein, pure water supply source 62c is, for example, industrial equipment, and has a configuration that pure water is supplied therefrom to sub nozzles 52 and 53 when valves V2 and V21 are opened. Herein, the industrial equipment is used for operating various apparatuses including the laser processing apparatus of the present invention in a factory. More specifically, the industrial equipment supplies various types of gas such as processing gas and operating gas, supplies various liquids such as cooling water and a processing liquid, discharges the liquids, and discharges the gas.

Figure 10:
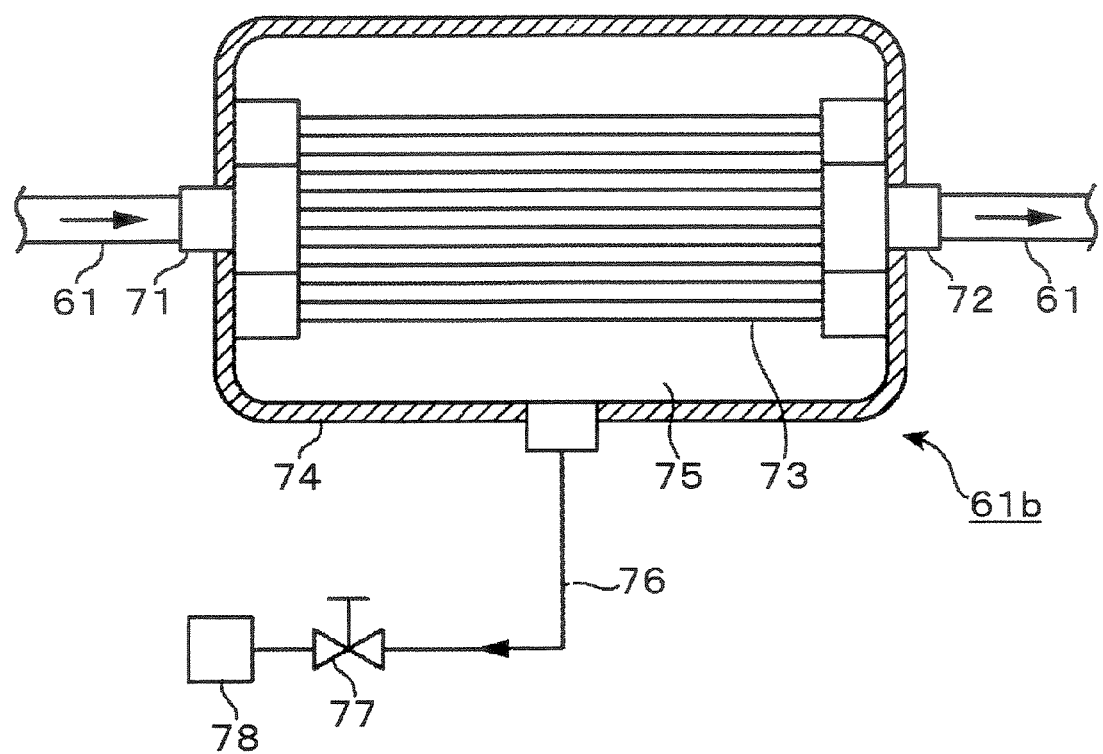
FIG. 10 illustrates a configuration of a deaeration unit in the embodiment.

First and second deaeration units 61a and 62b have a similar configuration. FIG. 10 is a vertical side view illustrating second deaeration unit 61b. Second deaeration unit 61b includes an inlet-side joint 71 connected to an upstream side of first liquid supply channel 61, and an outlet-side joint 72 connected to a downstream side of first liquid supply channel 61. A large number of fine canals 73 each having both ends connected to first liquid supply channel 61 through joints 71 and 72, respectively, are formed by a gas transmitting film material that is made of polytetrafluoroetylene resin and has pores. A chamber 74 surrounds fine canals 73 to form a hermetic space 75. Chamber 74 is connected with one end of a deaeration conduit 76 communicated with hermetic space 75. The other end of deaeration conduit 76 is connected to a gas discharge section 78 such as an ejector pump through a pressure adjustment valve 77.

When pressure adjustment valve 77 is opened, hermetic space 75 is depressurized in accordance with an opening degree of pressure adjustment valve 77 so as to keep a predetermined pressure. In this state, when pure water flows from the upstream side of first liquid supply channel 61 into each fine canal 73, gas such as N₂ gas, which is dissolved in the pure water and is used as pressure applying gas, passes through the pore in each fine canal 73, enters hermetic space 75, and is removed from the pure water. The pure water from which the gas is removed as described above flows from each fine canal 73 into the downstream side of first liquid supply channel 61.

Each of purge nozzles 54 and 55 is connected with one end of a purge gas supply channel 63. The other end of purge gas supply channel 63 is connected to a supply source 63b of air such as purge gas through a valve V3 and a group of gas supply devices 63a in this order.

Each of the group of liquid supply devices 61a, the group of liquid supply devices 62a and the group of gas supply devices 63a includes, for example, a mass-flow controller and a pump, and controls flow rates of pure water and purge gas flowing through first liquid supply channel 61, second liquid supply channel 62 and gas supply channel 63.

Upon implementation of the laser processing for wafer W, first, valve V1 is opened. Then, when N₂ gas supply source 61e supplies N₂ gas to pure water reservoir tank 61c, and a pressure in pure water reservoir tank 61c is increased, so that pure water is supplied to the downstream side of first liquid supply channel 61 and is ejected from main nozzle 51. Moreover, valves V2 and V21 are also opened at the almost same time that the valve V1 is opened, the industrial equipment supplies pure water to the downstream side of second liquid supply channel 62, so that the pure water is ejected from sub nozzles 52 and 53. Herein, the pure water ejected from main nozzle 51 through the group of liquid supply devices 61a is controlled to have a flow rate in a range from 20 m/s to 30 m/s. If the flow rate is less than 20 m/s, there is a possibility that air bubbles generated in pure water due to the laser processing cannot be sufficiently washed out. On the other hand, if the flow rate exceeds 30 m/s, there is a possibility that a liquid stream damages a film on the surface of wafer W. The group of liquid supply devices 62a sets a flow rate of the pure water ejected from sub nozzles 52 and 53 at, for example, 1 m/s which is slower than the flow rate of the pure water ejected from main nozzle 51.

Figure 12:
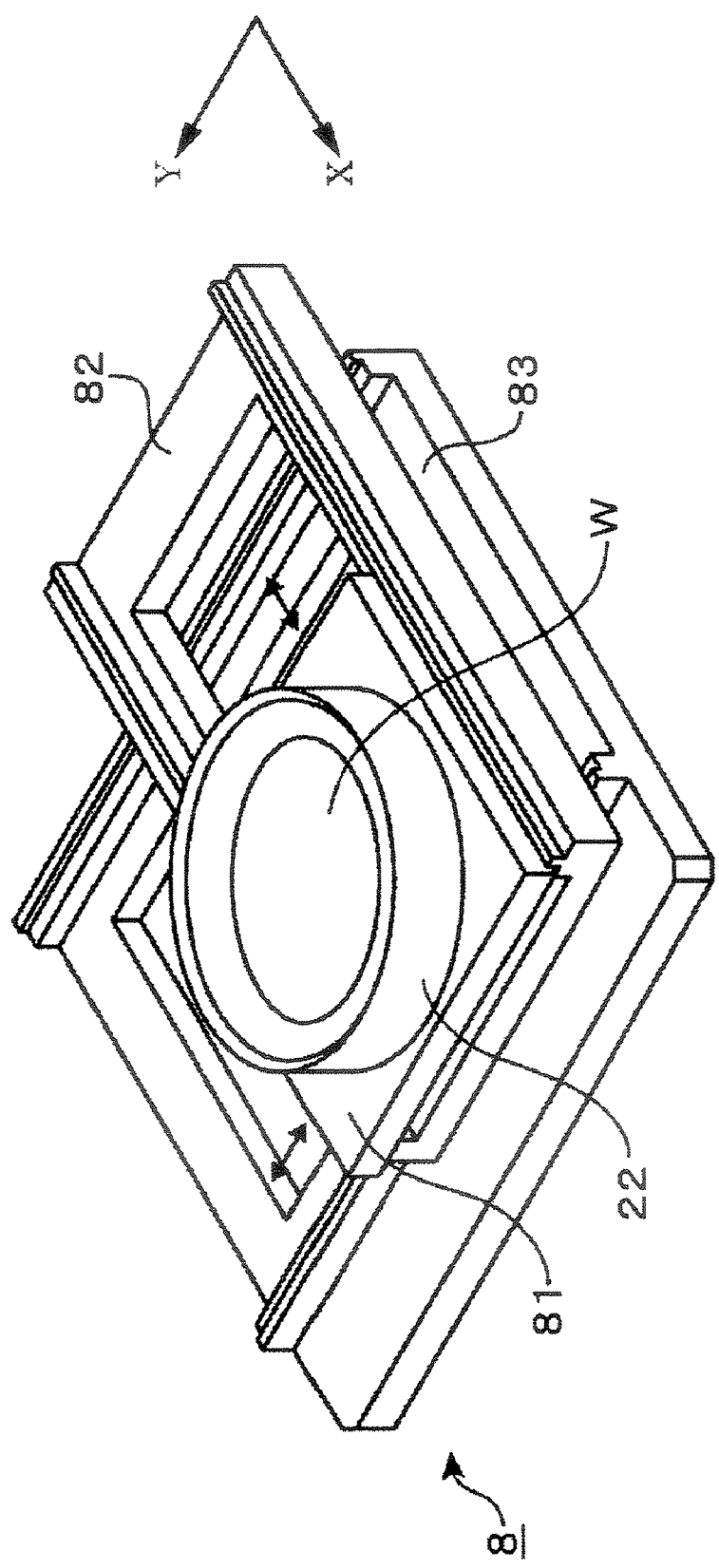
FIG. 12 is a perspective view schematically illustrating a cup and a movement mechanism in the embodiment.

When the pure water is ejected from each of nozzles 51 to 53 upon implementation of the laser processing for wafer W, as illustrated in FIG. 12, streams of the pure water ejected from sub nozzles 52 and 53 merge with a stream of the pure water ejected from main nozzle 51 by a pressure difference therebetween. In addition, the stream of the pure water ejected from main nozzle 51 is prevented from dispersion by the streams of the pure water ejected from sub nozzles 52 and 53. A liquid stream 91 merged as described above forms a liquid film between wafer W and guide member 56, passes below guide member 56 as shown by an arrow in the figure, is directed to recovery nozzle 42a, is sucked by recovery nozzle 42a, and is removed from wafer W. By formation of such a liquid stream, substances to be removed, which are formed on wafer W in the laser processing, can be removed from wafer W together with the liquid without dispersion of the substances to be removed.

When valve V3 is opened so as to supply purge gas to purge gas supply channel 72, purge nozzles 54 and 55 supply the purge gas toward the bottom face of guide member 56.

As shown by a chain line in FIG. 1, the laser processing apparatus according to this embodiment includes X-Y stage 8 serving as a movement mechanism for allowing cup 22 and chuck 21 to move along a horizontal plane. As illustrated in FIG. 12, X-Y stage 8 includes a stage 81 on which cup 22 is mounted, and a stage 82 having a drive mechanism for allowing stage 81 to move in an X direction. Stage 82 can move in a Y direction on a base 83 fixed to the casing (not illustrated) serving as the exterior of the laser processing apparatus.

Figure 13A:
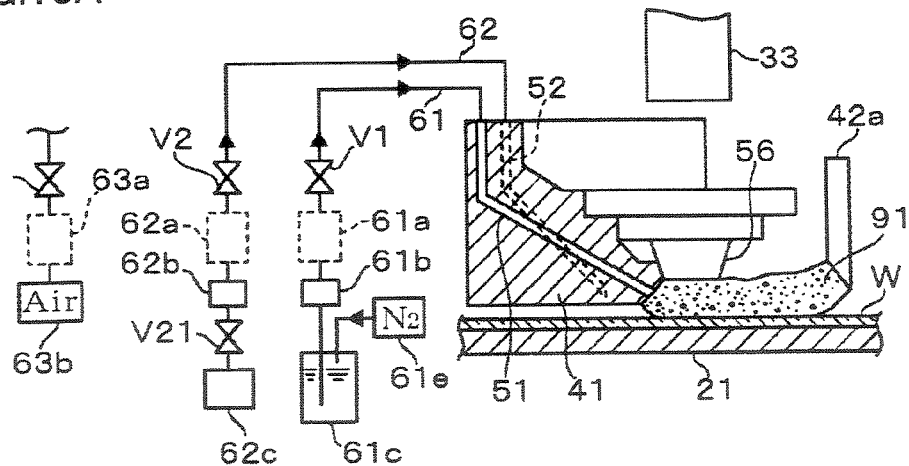
FIGS. 13A to 13C illustrate a state that the laser processing apparatus illustrated in FIG. 1 performs laser processing through a liquid film and drying processing on a guide member by means of purge gas.
Figure 13B:
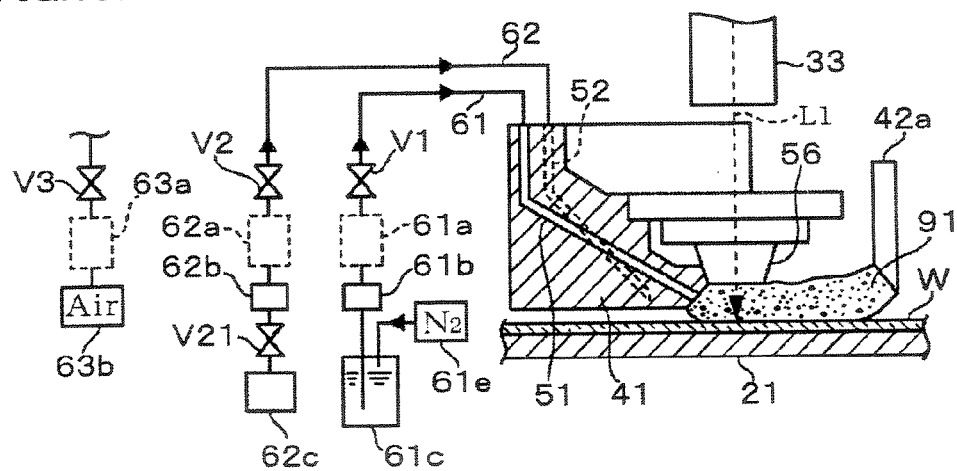
Figure 13C:
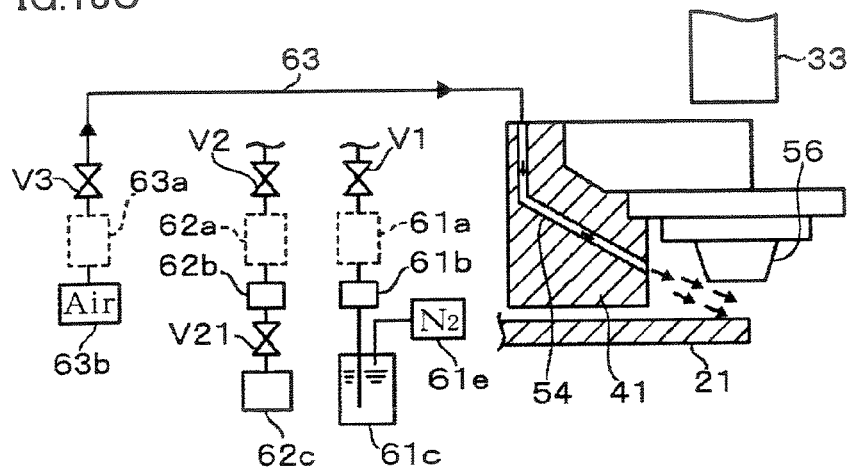

Next, with reference to FIGS. 13A to 13C, description will be given of a procedure for performing dicing on wafer W having the surface on which a polyimide film having an integrated circuit formed thereon is formed by the laser processing apparatus. First, wafer W is transferred to chuck 21 in cup 22 located at a transfer position through a transport arm (not illustrated). This operation is performed by vertical movement of chuck 21, for example. Then, CCD camera 34 detects an orientation flat, a notch, a target mark or the like serving as an alignment portion formed on wafer W mounted on chuck 21. The alignment of wafer W is performed based on the detected position. Next, X-Y stage 8 allows chuck 21 and cup 22 to move, so that a dicing start point on wafer W is located on optical axis L1 of laser beam radiation part 3.

Figure 11:
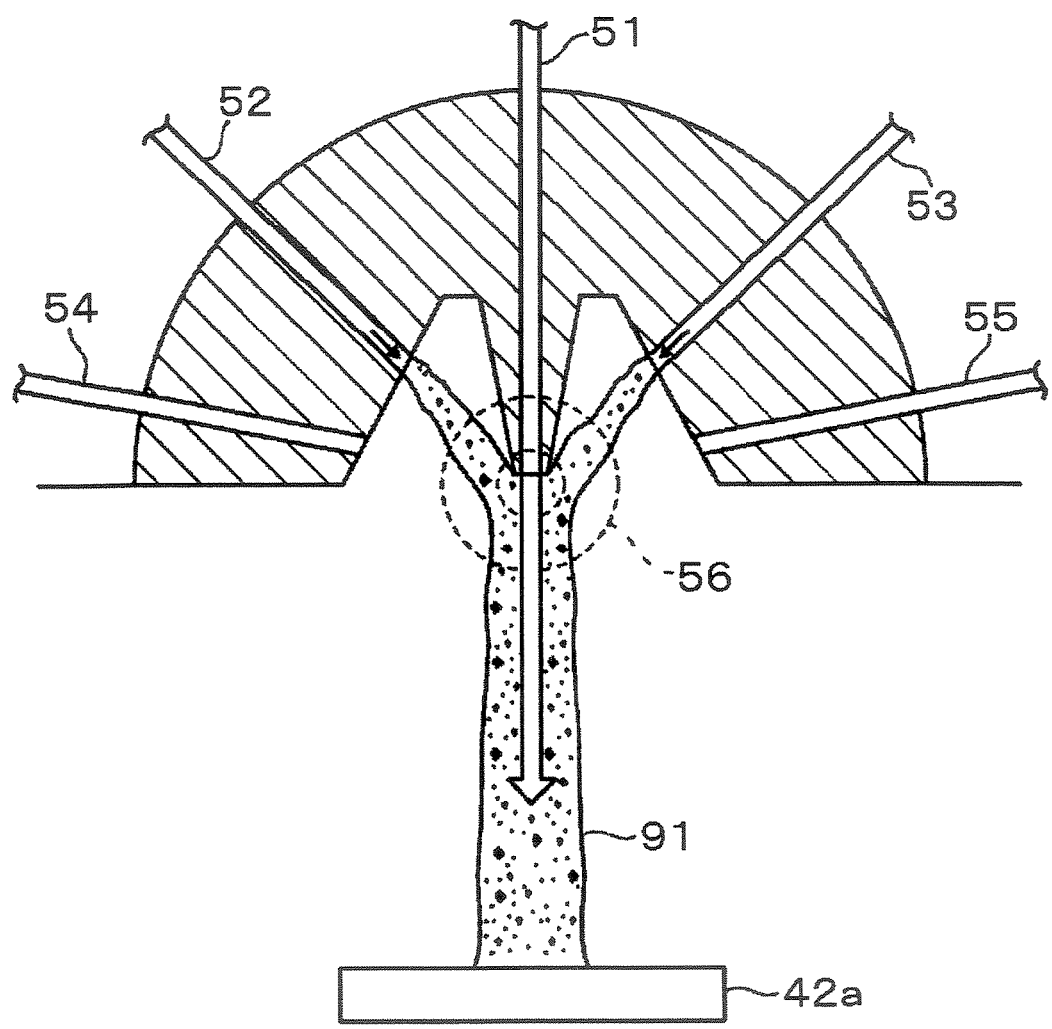
FIG. 11 illustrates a stream of a liquid supplied from the nozzle unit.

After movement of chuck 21 and cup 22, vertical-movement mechanism 48 allows optical unit 33, nozzle unit 41 and recovery nozzle 42a to move from the standby position to the processing position through holding arm 47. Nozzle unit 41 is arranged such that when laser beam radiation part 3 radiates a laser beam to wafer W, a center of a radiation spot S of the laser beam is in a projection region on the surface of wafer W upon extension of ejection port 51a of main nozzle 51 in an ejection direction. Next, valve V1 is opened, N₂ gas is supplied from gas supply source 61e to reservoir tank 61c, and pure water flows into first liquid supply channel 61. The pure water flowing into first liquid supply channel 61 is deaerated by deaeration unit 61b as described above, is subjected to flow rate limitation by the group of liquid supply devices 61a, and is ejected from main nozzle 51 onto wafer W at a flow rate of, for example, 20 m/s. Moreover, valves V2 and V21 are opened at the almost same time that valve V1 is opened, pure water supplied from the industrial equipment to the downstream side of second liquid supply channel 62 is deaerated by deaeration unit 62b, is subjected to flow rate limitation by the group of liquid supply devices 62a, and is ejected from sub nozzles 52 and 53 onto wafer W at a flow rate of, for example, 1 m/s at the almost same time that the pure water is ejected from main nozzle 51. The pure water ejected from each of nozzles 51 to 53 forms liquid stream 91 directed toward recovery nozzle 42a as illustrated in FIG. 11, so that a liquid film is formed between wafer W and guide member 56 (FIG. 13A). For example, when sucking section 42d of liquid recovery part 42 is operated at the almost same time that valves V1, V2 and V21 are opened, liquid stream 91 directed toward recovery nozzle 42a is sucked and removed from wafer W.

Figure 14:
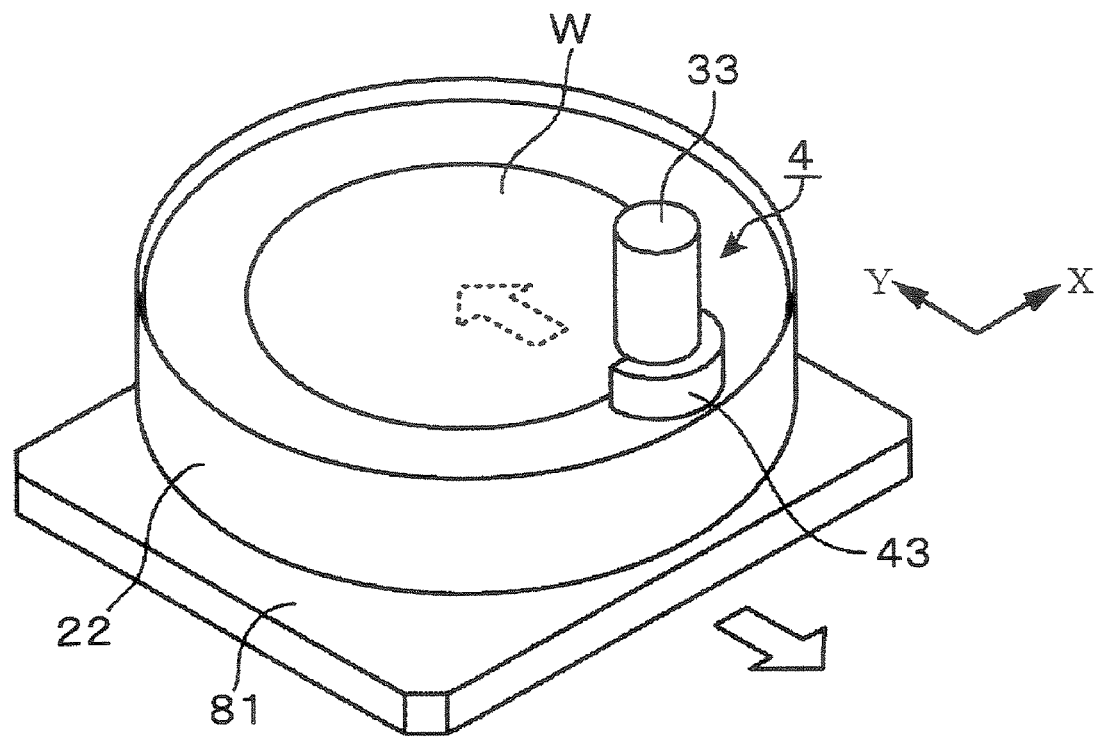
FIG. 14 is a perspective view illustrating a state that the laser processing apparatus illustrated in FIG. 1 performs the laser processing through the liquid film.

In a state that liquid stream 91 is formed on wafer W, laser beam radiation part 3 radiates a laser beam to the surface of wafer W through guide member 56. Concurrently, as illustrated in FIG. 14, X-Y stage 8 allows chuck 21 and cup 22 to move in the Y direction and, then, in the X direction, so as to perform scanning on the surface of wafer W with the laser beam in a dice pattern. Herein, liquid stream 91 is formed in a direction of an arrow shown by a dot line in each of FIGS. 13A to 13C. As a result, the surface of wafer W is cut by the laser beam, in other words, wafer W is subjected to half cutting; thus, a dicing line is formed (FIG. 13B). Herein, wafer W having the dicing line formed thereon is cut along the dicing line from its rear side in a subsequent step, so as to be diced into chips. Cuttings by the laser beam is recovered by recovery nozzle 42a together with liquid stream 91. Most of pure water supplied from each of nozzles 51 to 53 is recovered by recovery nozzle 42a. However, the remaining pure water is dropped on cup 22 and, then, is discharged from cup 22 through discharge port 23.

After the formation of the dicing line by the laser beam, valves V1 and V2 are closed, so that ejection of the pure water from each of nozzles 51 to 53 is stopped. Subsequently, drive part 21a allows chuck 21 to rotate at high speed while air is discharged through discharge port 23, so that pure water is completely removed from wafer W. Thus, wafer W is dried.

Figure 15:
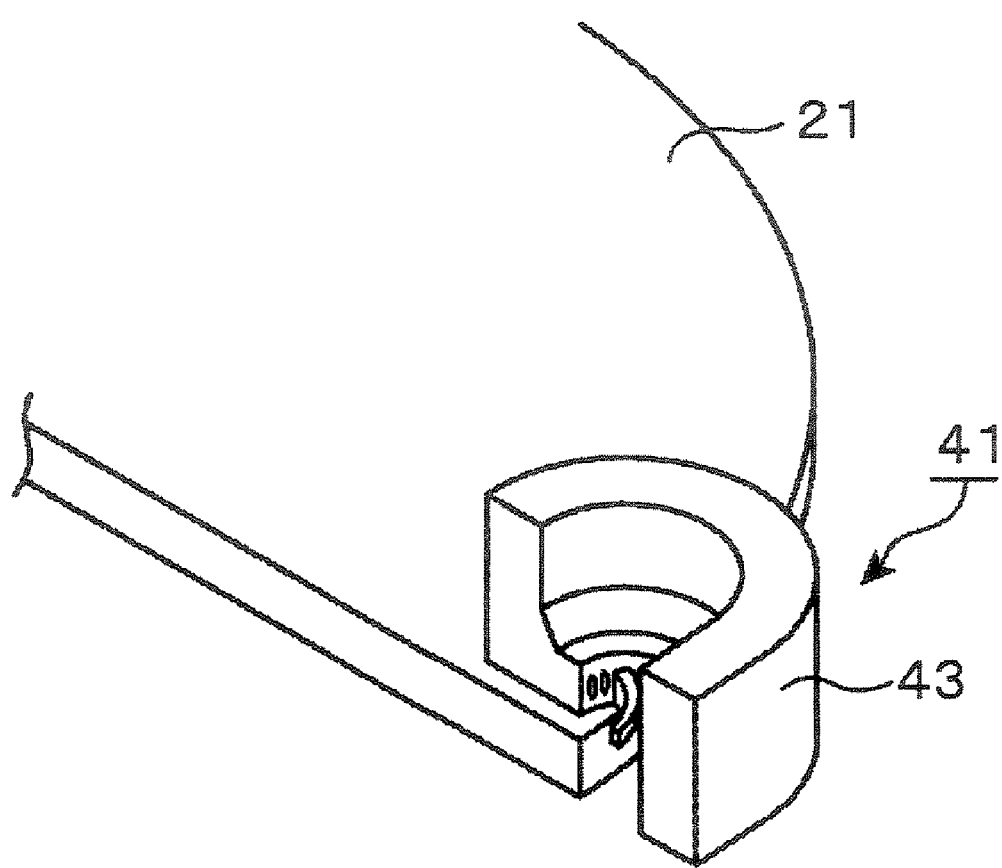
FIG. 15 is a perspective view illustrating a state that the laser processing apparatus illustrated in FIG. 1 dries the guide member and an outer end face of the chuck by means of purge gas.

After finish of a sequence of the steps, nozzle unit 41 and guide member 56 are allowed to move to the standby position, respectively. Then, chuck 21 moves upward, so that wafer W is transferred to the transport arm (not illustrated). Subsequently, nozzle unit 41 or chuck 21 is allowed to move before a next wafer W is transferred to chuck 21 such that nozzle unit 41 is located at a region in the vicinity of an outer edge of chuck 21 as illustrated in FIG. 15. Next, valve V3 is opened, and purge gas in gas supply source 63b is ejected from purge nozzles 54 and 55 toward a region in the vicinity of an outer end face of chuck 21 through purge gas supply channel 63. Further, chuck 21 is allowed to rotate at a predetermined rotational speed, for example, about 1000 rpm. The ejected purge gas passes the bottom face of guide member 56 and is attached to the region in the vicinity of the outer end face of chuck 21, so that pure water attached to the bottom face of guide member 56 and pure water attached to the region in the vicinity of the outer end face of chuck 21 are blown off. Thus, these components are dried (FIG. 13C). For example, after the purge gas is supplied for a predetermined period of time and the aforementioned drying operation is finished, valve V3 is closed so as to stop supply of purge gas.

According to this embodiment, main nozzle 51 including ejection port 51a having a bore in a range from 0.4 mm to 1.0 mm supplies pure water to wafer W at a flow rate in a range from 20 m/s to 30 m/s in a direction of a depression angle in a range from 20° to 35°. Further, X-Y stage 8 allows chuck 21 holding wafer W to move such that radiation spot S of the laser beam from laser beam radiation part 3 shifts in the surface of wafer W in a state that the center of radiation spot S is in the projection region on the surface of wafer W when ejection port 51a of main nozzle 51 is extended in an ejection direction. In the laser processing apparatus according to this embodiment, even when plasma generated at a target position, that is, radiation spot S of the laser beam by radiation of wafer W with the laser beam causes air bubbles generated in the pure water on radiation spot S, the air bubbles are efficiently washed out from the target position, that is, radiation spot S of the laser beam on wafer W, so that scattered reflection of the laser beam can be suppressed as indicated by an evaluation test (to be described later). As a result, the target position on wafer W can be radiated with the laser beam with high accuracy.

According to this embodiment, further, main nozzle 51 is connected to pure water reservoir tank 61c through first liquid supply channel 61, and first liquid supply channel 61 is provided with first deaeration unit 61b. In addition, sub nozzles 52 and 53 are connected to liquid supply source 62c, which is industrial equipment, through second liquid supply channel 62, and second liquid supply channel 62 is connected with second deaeration unit 62b. With this configuration, when $N_2$ gas is supplied from gas supply source 61e to reservoir tank 61c so that pure water is supplied to main nozzle 51 while being applied with a pressure, $N_2$ gas dissolved in the pure water is deaerated and removed. Further, when pure water is supplied to the downstream side of second liquid supply channel 62 through the industrial equipment while being applied with a pressure, $N_2$ gas dissolved in the pure water is also deaerated and removed. Accordingly, occurrence of cavitation can be prevented upon ejection of pure water from each nozzle. As a result, air bubbles can be prevented from being generated in the pure water supplied onto wafer W, and optical scattering of the laser beam due to the air bubbles can be suppressed.

The laser processing apparatus according to this embodiment is applicable to the aforementioned laser processing forming a dicing line and, also, is applicable to laser processing for correction of a mask or marking.

In this embodiment, first and second deaeration units 61b and 62b may not be limited to the aforementioned configuration as long as they can deaerate pure water passing through first and second liquid supply channels 61 and 62. In order to deaerate the pure water with certainty, for example, fine canals 73 of first deaeration unit 61b may be radiated with an ultrasonic wave so that $N_2$ gas is separated from the pure water.

The pressure applying gas may be air or Ar (argon) gas in addition to $N_2$ gas.

Figure 16:
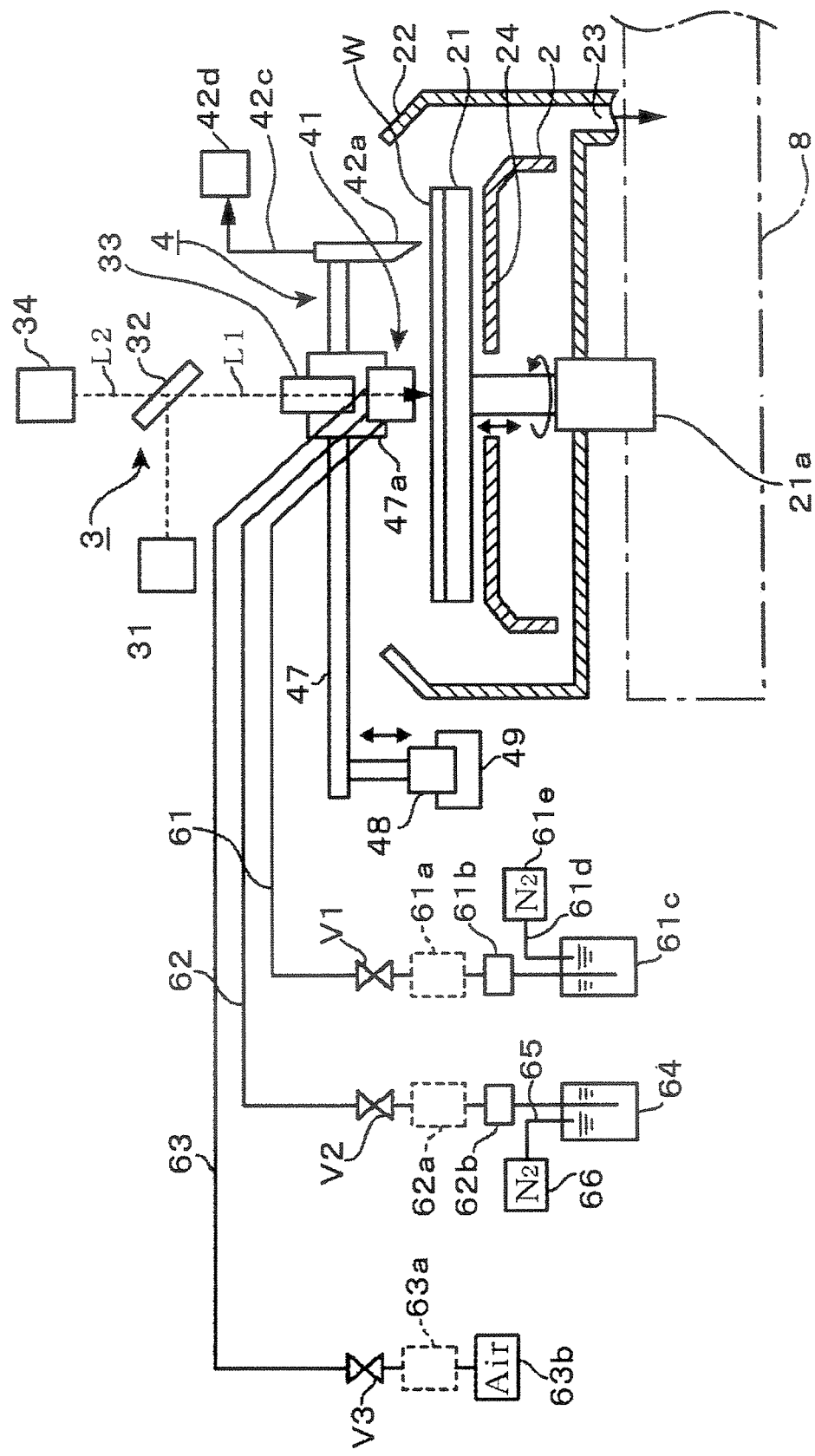
FIG. 16 is a vertical sectional view illustrating a general configuration of a laser processing apparatus according to another embodiment of the present invention.
Figure 18A:
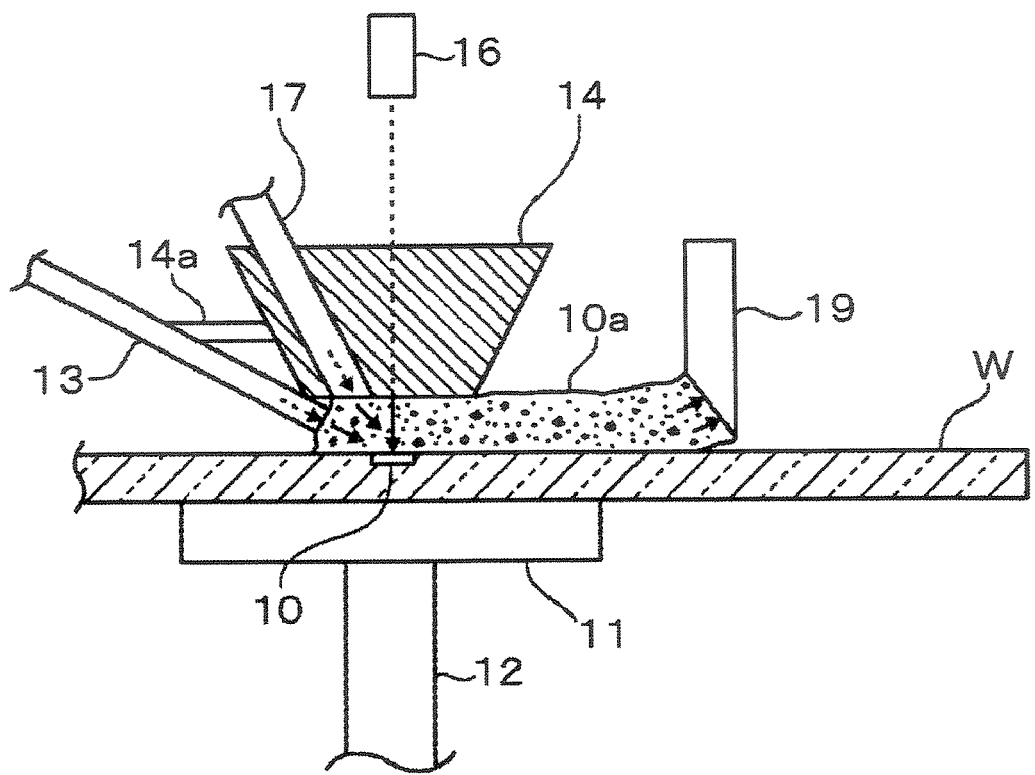
FIGS. 18A and 18B illustrate a state of separation of a film surface on a substrate in laser processing.
Figure 18B:
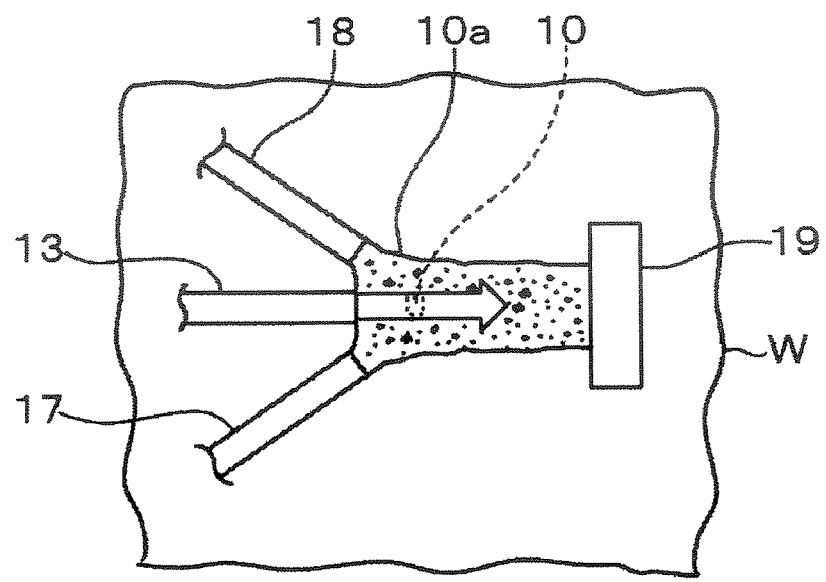

The laser processing apparatus may be configured as illustrated in FIG. 16 in order to supply pure water to sub nozzles 52 and 53 without aid of the industrial equipment. This laser processing apparatus may be configured as follows. That is, the other end of second liquid supply channel 62 connected to sub nozzles 52 and 53 is connected to pure water reservoir tank 64, which is a pure water reservoir part, through valve V2, the group of liquid supply devices 62a and second deaeration unit 62b in this order. Further, at a gaseous phase portion of reservoir tank 64, one end of supply channel 65 for pressure applying gas is opened for supplying the pure water to the downward side of second liquid supply channel 62. The other end of gas supply channel 65 is connected to gas supply source 66 having $N_2$ stored therein. In such an apparatus, as in a similar manner to that in the aforementioned laser processing apparatus, valve V2 is opened at the almost same time that valve V1 is opened and pure water is ejected from main nozzle 51. Further, $N_2$ gas is supplied from gas supply source 66, so that the pure water in pure water reservoir tank 64 is supplied to sub nozzles 52 and 53. Except for such a difference, this laser processing apparatus is configured as in a similar manner to that in the laser processing apparatus illustrated in FIG. 1.

(Evaluation Test)

An evaluation test was carried out as follows by means of a laser processing apparatus similar to that described in the aforementioned embodiment. That is, in accordance with the aforementioned procedure, wafer W, which is a Si (silicon) substrate having a surface on which a polyimide film is formed, was radiated with a laser beam. Concurrently, X-Y stage 8 was allowed to move in a predetermined direction by a predetermined distance and the polyimide film was cut away, so that a linear dicing line (groove) was formed on the surface of wafer W. Then, a shape of the dicing line and a degree of damage of the polyimide film at a periphery of the dicing line were evaluated.

In Evaluation Test 1, there was used main nozzle 51 including ejection port 51a having a bore of 0.4 mm as shown by "1" in FIG. 7. In addition, a distance between a center of ejection port 51a and wafer W was set at 1.5 mm as shown by "h2" in FIG. 7. A flow rate of pure water ejected from ejection port 51a and an angle of main nozzle 51 as shown by "θ" in FIG. 7 are varied for each wafer W to be subjected to laser processing; thus, a dicing line was formed. Herein, the center of radiation spot S of the laser beam was in projection region R when ejection port 51a was extended in the ejection direction. Also in subsequent evaluation tests, similarly, radiation spot S of the laser beam was in projection region R.

In Evaluation Test 1, the flow rate was set at 20 m/s and angle θ was set at 20° as Example 1-1, the flow rate was set at 20 m/s and angle θ was set at 35° as Example 1-2, the flow rate was set at 30 m/s and angle θ was set at 35° as Example 1-3, and the flow rate was set at 30 m/s and angle θ was set at 20° as Example 1-4.

Also in Evaluation Test 1, the flow rate was set at 15 m/s and angle θ was set at 20° as Comparative Example 1-1, the flow rate was set at 15 m/s and angle θ was set at 35° as Comparative Example 1-2, the flow rate was set at 20 m/s and angle θ was set at 15° as Comparative Example 1-3, the flow rate was set at 30 m/s and angle θ was set at 15° as Comparative Example 1-4, the flow rate was set at 20 m/s and angle θ was set at 40° as Comparative Example 1-5, and the flow rate was set at 35 m/s and angle θ was set at 20° as Comparative Example 1-6.

As for evaluation of the dicing line formed as described above, as illustrated in FIGS. 17A to 17C, if the dicing line had an even width, the polyimide film was neither damaged nor peeled off at a periphery of the dicing line and the dicing line was formed clearly, the dicing line was evaluated as no-failure (Evaluation: G). On the other hand, as illustrated in FIGS. 17D to 17F, if the polyimide film was damaged and peeled at the periphery of the dicing line so that the dicing line had uneven width or was not formed clearly, the dicing line was evaluated as failure (Evaluation: W). Table 1 shows results of Examples 1-1 to 1-4 and results of Comparative Examples 1-1 to 1-6. As shown in Table 1, the dicing lines in Examples 1-1 to 1-4 were evaluated as no-failure; however, the dicing lines in Comparative Examples 1-1 to 1-6 were evaluated as failure.

TABLE 1

| Bore 1: 0.4 mm, Distance h2: 1.5 mm | | | |
|---|---|---|---|
| | Flow rate (m/s) | Angle θ | Evaluation |
| Example 1-1 | 20 | 20 | G |
| Example 1-2 | 20 | 35 | G |
| Example 1-3 | 30 | 35 | G |
| Example 1-4 | 30 | 20 | G |
| Comparative Example 1-1 | 15 | 20 | W |
| Comparative Example 1-2 | 15 | 35 | W |
| Comparative Example 1-3 | 20 | 15 | W |
| Comparative Example 1-4 | 30 | 15 | W |
| Comparative Example 1-5 | 20 | 40 | W |
| Comparative Example 1-6 | 35 | 20 | W |

In Evaluation Test 2, subsequently, bore 1 of ejection port 51a of main nozzle 51 was set at 1.0 mm, and distance h2 between the center of ejection port 51a and wafer W was set at 0.5 mm. As in a similar manner to that in Evaluation Test 1, the flow rate of the pure water ejected from ejection port 51a and angle θ of main nozzle 51 were varied for each wafer W to be subjected to laser processing; thus, a dicing line was formed.

In Evaluation Test 2, the flow rate was set at 20 m/s and angle θ was set at 20° as Example 2-1, the flow rate was set at 20 m/s and angle θ was set at 35° as Example 2-2, the flow rate was set at 30 m/s and angle θ was set at 35° as Example 2-3, and the flow rate was set at 30 m/s and angle θ was set at 20° as Example 2-4.

Also in Evaluation Test 2, the flow rate was set at 15 m/s and angle θ was set at 20° as Comparative Example 2-1, the flow rate was set at 15 m/s and angle θ was set at 35° as Comparative Example 2-2, the flow rate was set at 20 m/s and angle θ was set at 15° as Comparative Example 2-3, the flow rate was set at 30 m/s and angle θ was set at 15° as Comparative Example 2-4, the flow rate was set at 20 m/s and angle θ was set at 40° as Comparative Example 2-5, and the flow rate was set at 35 m/s and angle θ was set at 20° as Comparative Example 2-6.

Table 2 shows results of Examples 2-1 to 2-4 and results of Comparative Examples 2-1 to 2-6. As shown in Table 2, the dicing lines in Examples 2-1 to 2-4 were evaluated as no-failure, respectively; however, the dicing lines in Comparative Examples 2-1 to 2-6 were evaluated as failure, respectively.

TABLE 2

Bore 1: 1.0 mm, Distance h2: 0.5 mm

|  | Flow rate (m/s) | Angle θ | Evaluation |
|---|---|---|---|
| Example 2-1 | 20 | 20 | G |
| Example 2-2 | 20 | 35 | G |
| Example 2-3 | 30 | 35 | G |
| Example 2-4 | 30 | 20 | G |
| Comparative Example 2-1 | 15 | 20 | W |
| Comparative Example 2-2 | 15 | 35 | W |
| Comparative Example 2-3 | 20 | 15 | W |
| Comparative Example 2-4 | 30 | 15 | W |
| Comparative Example 2-5 | 20 | 40 | W |
| Comparative Example 2-6 | 35 | 20 | W |

In Evaluation Test 3, subsequently, bore 1 of ejection port 51a of main nozzle 51 was set at 0.4 mm, and distance h2 between the center of ejection port 51a and wafer W was set at 0.5 mm. As in a similar manner to that in Evaluation Test 1, the flow rate of the pure water ejected from ejection port 51a and angle θ of main nozzle 51 were varied for each wafer W to be subjected to laser processing; thus, a dicing line was formed.

In Evaluation Test 3, the flow rate was set at 20 m/s and angle θ was set at 20° as Example 3-1, the flow rate was set at 20 m/s and angle θ was set at 35° as Example 3-2, the flow rate was set at 30 m/s and angle θ was set at 35° as Example 3-3, and the flow rate was set at 30 m/s and angle θ was set at 20° as Example 3-4.

Also in Evaluation Test 3, the flow rate was set at 15 m/s and angle θ was set at 20° as Comparative Example 3-1, the flow rate was set at 15 m/s and angle θ was set at 35° as Comparative Example 3-2, the flow rate was set at 20 m/s and angle θ was set at 15° as Comparative Example 3-3, the flow rate was set at 30 m/s and angle θ was set at 15° as Comparative Example 3-4, the flow rate was set at 20 m/s and angle θ was set at 40° as Comparative Example 3-5, and the flow rate was set at 35 m/s and angle θ was set at 20° as Comparative Example 3-6.

Table 3 shows results of Examples 3-1 to 3-4 and results of Comparative Examples 3-1 to 3-6. As shown in Table 3, the dicing lines in Examples 3-1 to 3-4 were evaluated as no-failure, respectively; however, the dicing lines in Comparative Examples 3-1 to 3-6 were evaluated as failure, respectively.

TABLE 3

Bore 1: 0.4 mm, Distance h2: 0.5 mm

|  | Flow rate (m/s) | Angle θ | Evaluation |
|---|---|---|---|
| Example 3-1 | 20 | 20 | G |
| Example 3-2 | 20 | 35 | G |
| Example 3-3 | 30 | 35 | G |
| Example 3-4 | 30 | 20 | G |
| Comparative Example 3-1 | 15 | 20 | W |
| Comparative Example 3-2 | 15 | 35 | W |
| Comparative Example 3-3 | 20 | 15 | W |
| Comparative Example 3-4 | 30 | 15 | W |
| Comparative Example 3-5 | 20 | 40 | W |
| Comparative Example 3-6 | 35 | 20 | W |

In Evaluation Test 4, subsequently, bore 1 of ejection port 51a of main nozzle 51 was set at 1.0 mm, and distance h2 between the center of ejection port 51a and wafer W was set at 1.5 mm. As in a similar manner to that in Evaluation Test 1, the flow rate of the pure water ejected from ejection port 51a and angle θ of main nozzle 51 were varied for each wafer W to be subjected to laser processing; thus, a dicing line was formed.

In Evaluation Test 4, the flow rate was set at 20 m/s and angle θ was set at 20° as Example 4-1, the flow rate was set at 20 m/s and angle θ was set at 35° as Example 4-2, the flow rate was set at 30 m/s and angle θ was set at 35° as Example 4-3, and the flow rate was set at 30 m/s and angle θ was set at 20° as Example 4-4.

Also in Evaluation Test 4, the flow rate was set at 15 m/s and angle θ was set at 20° as Comparative Example 4-1, the flow rate was set at 15 m/s and angle θ was set at 35° as Comparative Example 4-2, the flow rate was set at 20 m/s and angle θ was set at 15° as Comparative Example 4-3, the flow rate was set at 30 m/s and angle θ was set at 15° as Comparative Example 4-4, the flow rate was set at 20 m/s and angle θ was set at 40° as Comparative Example 4-5, and the flow rate was set at 35 m/s and angle θ was set at 20° as Comparative Example 4-6.

Table 4 shows results of Examples 4-1 to 4-4 and results of Comparative Examples 4-1 to 4-6. As shown in Table 4, the dicing lines in Examples 4-1 to 4-4 were evaluated as no-failure, respectively; however, the dicing lines in Comparative Examples 4-1 to 4-6 were evaluated as failure, respectively.

TABLE 4

Bore 1: 1.0 mm, Distance h2: 1.5 mm

|  | Flow rate (m/s) | Angle θ | Evaluation |
|---|---|---|---|
| Example 4-1 | 20 | 20 | G |
| Example 4-2 | 20 | 35 | G |
| Example 4-3 | 30 | 35 | G |
| Example 4-4 | 30 | 20 | G |
| Comparative Example 4-1 | 15 | 20 | W |
| Comparative Example 4-2 | 15 | 35 | W |
| Comparative Example 4-3 | 20 | 15 | W |
| Comparative Example 4-4 | 30 | 15 | W |
| Comparative Example 4-5 | 20 | 40 | W |
| Comparative Example 4-6 | 35 | 20 | W |

In Evaluation Test 5, subsequently, bore 1 of ejection port 51a of main nozzle 51 was set at 0.2 mm, and distance h2 between the center of ejection port 51*a* and wafer W was set at 0.5 mm. As in a similar manner to that in Evaluation Test 1, the flow rate of the pure water ejected from ejection port 51*a* and angle θ of main nozzle 51 were varied for each wafer W; thus, laser processing was carried out.

In Evaluation Test 5, the flow rate was set at 20 m/s and angle θ was set at 20° as Comparative Example 5-1, the flow rate was set at 20 m/s and angle θ was set at 35° as Comparative Example 5-2, the flow rate was set at 30 m/s and angle θ was set at 35° as Comparative Example 5-3, the flow rate was set at 30 m/s and angle θ was set at 20° as Comparative Example 5-4, the flow rate was set at 15 m/s and angle θ was set at 20° as Comparative Example 5-5, the flow rate was set at 15 m/s and angle θ was set at 35° as Comparative Example 5-6, the flow rate was set at 20 m/s and angle θ was set at 15° as Comparative Example 5-7, the flow rate was set at 30 m/s and angle θ was set at 15° as Comparative Example 5-8, the flow rate was set at 20 m/s and angle θ was set at 40° as Comparative Example 5-9, and the flow rate was set at 35 m/s and angle θ was set at 20° as Comparative Example 5-10. Table 5 shows results of Comparative Examples 5-1 to 5-10. As shown in Table 5, the dicing lines in Comparative Examples 5-1 to 5-10 were evaluated as failure, respectively.

TABLE 5

Bore 1: 0.2 mm, Distance h2: 0.5 mm

|  | Flow rate (m/s) | Angle θ | Evaluation |
| --- | --- | --- | --- |
| Comparative Example 5-1 | 20 | 20 | W |
| Comparative Example 5-2 | 20 | 35 | W |
| Comparative Example 5-3 | 30 | 35 | W |
| Comparative Example 5-4 | 30 | 20 | W |
| Comparative Example 5-5 | 15 | 20 | W |
| Comparative Example 5-6 | 15 | 35 | W |
| Comparative Example 5-7 | 20 | 15 | W |
| Comparative Example 5-8 | 30 | 15 | W |
| Comparative Example 5-9 | 20 | 40 | W |
| Comparative Example 5-10 | 35 | 20 | W |

In Evaluation Test 6, subsequently, bore 1 of ejection port 51*a* of main nozzle 51 was set at 1.5 mm, and distance h2 between the center of ejection port 51*a* and wafer W was set at 0.5 mm. As in a similar manner to that in Evaluation Test 1, the flow rate of the pure water ejected from ejection port 51*a* and angle θ of main nozzle 51 were varied for each wafer W; thus, a dicing line was formed.

In Evaluation Test 6, the flow rate was set at 20 m/s and angle θ was set at 20° as Comparative Example 6-1, the flow rate was set at 20 m/s and angle θ was set at 35° as Comparative Example 6-2, the flow rate was set at 30 m/s and angle θ was set at 35° as Comparative Example 6-3, the flow rate was set at 30 m/s and angle θ was set at 20° as Comparative Example 6-4, the flow rate was set at 15 m/s and angle θ was set at 20° as Comparative Example 6-5, the flow rate was set at 15 m/s and angle θ was set at 35° as Comparative Example 6-6, the flow rate was set at 20 m/s and angle θ was set at 15° as Comparative Example 6-7, the flow rate was set at 30 m/s and angle θ was set at 15° as Comparative Example 6-8, the flow rate was set at 20 m/s and angle θ was set at 40° as Comparative Example 6-9, and the flow rate was set at 35 m/s and angle θ was set at 20° as Comparative Example 6-10. Table 6 shows results of Comparative Examples 6-1 to 6-10. As shown in Table 6, the dicing lines in Comparative Examples 6-1 to 6-10 were evaluated as failure, respectively.

TABLE 6

Bore 1: 1.5 mm, Distance h.2: 0.5 mm

|  | Flow rate (m/s) | Angle θ | Evaluation |
| --- | --- | --- | --- |
| Comparative Example 6-1 | 20 | 20 | W |
| Comparative Example 6-2 | 20 | 35 | W |
| Comparative Example 6-3 | 30 | 35 | W |
| Comparative Example 6-4 | 30 | 20 | W |
| Comparative Example 6-5 | 15 | 20 | W |
| Comparative Example 6-6 | 15 | 35 | W |
| Comparative Example 6-7 | 20 | 15 | W |
| Comparative Example 6-8 | 30 | 15 | W |
| Comparative Example 6-9 | 20 | 40 | W |
| Comparative Example 6-10 | 35 | 20 | W |

In Evaluation Test 7, subsequently, bore 1 of ejection port 51*a* of main nozzle 51 was set at 0.6 mm, and the flow rate of the pure water was set at 20 m/s. In addition, angle θ of main nozzle 51 was set at 30°. Unlike the aforementioned evaluation tests, distance h2 between the center of ejection port 51*a* and wafer W was varied for each wafer W; thus, a dicing line was formed. In Evaluation Test 7, distance h2 is set at 0.3 mm as Example 7-1, distance h2 is set at 0.6 mm as Example 7-2, distance h2 is set at 0.9 mm as Example 7-3, distance h2 is set at 1.2 mm as Example 7-4, distance h2 is set at 1.5 mm as Example 7-5, distance h2 is set at 1.8 mm as Example 7-6, and distance h2 is set at 2.1 mm as Example 7-7.

Table 7 shows results of Examples 7-1 to 7-7. As shown in Table 7, the dicing lines in Examples 7-2 to 7-5 were evaluated as no-failure, respectively; however, the dicing lines in Examples 7-1, 7-6 and 7-7 were evaluated as failure, respectively.

TABLE 7

Bore 1: 0.6 mm, Flow rate: 20 m/s, Angle θ: 30°

|  | Distance h2 (mm) | Evaluation |
| --- | --- | --- |
| Example 7-1 | 0.3 | W |
| Example 7-2 | 0.6 | G |
| Example 7-3 | 0.9 | G |
| Example 7-4 | 1.2 | G |
| Example 7-5 | 1.5 | G |
| Example 7-6 | 1.8 | W |
| Example 7-7 | 2.1 | W |

It is clear from the results of the aforementioned evaluation tests that laser processing after adjustment of parameters such as an angle of pure water to be ejected to a substrate, a height from a center of an ejection port of a main nozzle to a substrate, a flow rate of pure water to be ejected from a main nozzle, and a bore of an ejection port of a main nozzle is effective at suppressing an influence of an air bubble generated due to plasma by a laser beam and radiating a laser beam to a wafer with high accuracy.

Although the present invention has been described and illustrated in detail, it is clearly understood that the same is by way of illustration and example only and is not to be taken by way of limitation, the spirit and scope of the present invention being limited only by the terms of the appended claims.

What is claimed is:
1. A laser processing apparatus comprising:
a substrate holding part that holds a substrate horizontally;
a laser beam radiation part that radiates a laser beam to a target position on the substrate to thereby carry out predetermined processing on a surface of the substrate;
a liquid supply source that supplies a liquid while applying a pressure to the liquid;

a liquid supply nozzle that is connected to said liquid supply source through a liquid supply channel, includes a liquid ejection port having a bore in a range from 0.4 mm to 1.0 mm, and ejects the liquid supplied from said liquid supply source to said substrate held by said substrate holding part at a flow rate in a range from 20 m/s to 30 m/s in a direction of a depression angle in a range from 20° to 35°;

a guide member that is provided above said substrate, guides the liquid ejected from said liquid supply nozzle such that the liquid passes between a bottom face thereof and the surface of said substrate, and is made of a transparent material through which the laser beam from said laser beam radiation part transmits; and a movement mechanism that moves said substrate holding part, and said laser beam radiation part, said guide member and said liquid supply nozzle relatively in a horizontal direction such that a radiation spot of the laser beam from the laser beam radiation part shifts in the surface of the substrate in a state that a center of the radiation spot is in a projection region on the surface of the substrate when the liquid ejection port of said liquid supply nozzle is extended in an ejection direction.

2. The laser processing apparatus according to claim 1, wherein a height from a center of the liquid ejection port to the substrate is in a range from 0.5 mm to 1.5 mm upon supply of the liquid to the substrate.

3. A laser processing apparatus comprising:

a substrate holding part that holds a substrate horizontally;

a laser beam radiation part that radiates a laser beam to a target position on the substrate to thereby carry out predetermined processing on a surface of the substrate;

a liquid supply source that supplies a liquid while applying a pressure to the liquid;

a liquid supply nozzle that is connected to said liquid supply source through a liquid supply channel, and supplies the liquid supplied from the liquid supply source onto said substrate through a liquid ejection port thereof;

a guide member that is provided above said substrate, guides the liquid supplied from said liquid supply nozzle such that the liquid passes between a bottom face thereof and the surface of said substrate, and is made of a transparent material through which the laser beam from said laser beam radiation part transmits;

a deaeration unit that removes gas in the liquid passing through said liquid supply channel; and a movement mechanism that moves said substrate holding part, and said laser beam radiation part and said guide member relatively in a horizontal direction in order to shift a radiation spot of the laser beam in the surface of said substrate.

4. The laser processing apparatus according to claim 3, wherein said liquid supply source includes a first liquid supply source that supplies gas from a gas supply source to a liquid reservoir part to thereby supply a liquid in the liquid reservoir part while applying a pressure to the liquid, and a second liquid supply source that is industrial equipment, the first liquid supply source is connected with a first liquid supply nozzle that washes out a substance to be processed on the substrate by the laser beam through a first liquid supply channel, the second liquid supply source is connected with a pair of second liquid supply nozzles that are located at both ends of the first liquid supply nozzle and control a stream of the liquid from the first liquid supply nozzle, the first liquid supply channel has a first deaeration unit that removes gas in the liquid passing through the first liquid supply channel, and the second liquid supply channel has a second deaeration unit that removes gas in the liquid passing through the second liquid supply channel.

5. A laser processing method comprising the steps of:

mounting a substrate on a substrate holding part horizontally;

supplying a liquid, supplied from a liquid supply source to a liquid supply nozzle, to the substrate at a flow rate in a range from 20 m/s to 30 m/s in a direction of a depression angle in a range from 20° to 35°, wherein said liquid supply source supplies the liquid through a liquid supply channel while applying a pressure to the liquid, and said liquid supply nozzle includes a liquid ejection port having a bore in a range from 0.4 mm to 1.0 mm and is connected to said liquid supply source;

radiating a laser beam to said substrate from a laser beam radiation part through a guide member provided above said substrate and made of a transparent material through which the laser beam from said laser beam radiation part transmits, in a state that the liquid ejected from said liquid supply nozzle is guided so as to pass between a bottom face of the guide member and the surface of said substrate; and moving said substrate holding part, and said laser beam radiation part, said guide member and said liquid supply nozzle relatively in a horizontal direction such that a radiation spot of the laser beam shifts in the surface of the substrate in a state that a center of the radiation spot is in a projection region on the surface of the substrate when the liquid ejection port of said liquid supply nozzle is extended in an ejection direction.

6. A laser processing method comprising the steps of:

mounting a substrate on a substrate holding part horizontally;

supplying a liquid from a liquid supply source for supplying the liquid while applying a pressure to the liquid to a liquid supply nozzle connected to the liquid supply source through a liquid supply channel, and ejecting the liquid from a liquid ejection port of said liquid supply nozzle onto said substrate;

deaerating the liquid passing through said liquid supply channel;

guiding the liquid ejected from said liquid supply nozzle by a guide member provided above said substrate and made of a transparent material through which a laser beam from a laser beam radiation part transmits, such that the liquid passes between a bottom face of said guide member and a surface of said substrate; and moving said substrate holding part, and said laser beam radiation part and said guide member relatively in a horizontal direction in order to shift a radiation spot of the laser beam in the surface of said substrate.

* * * * *